(12) United States Patent
Im et al.

(10) Patent No.: US 11,568,795 B2
(45) Date of Patent: Jan. 31, 2023

(54) CHIP-ON FILM PACKAGE AND DISPLAY DEVICE INCLUDING THE SAME

(71) Applicant: Samsung Display Co., Ltd., Yongin-Si (KR)

(72) Inventors: Tae Gon Im, Yongin-si (KR); Min Soo Choi, Yongin-si (KR); Ji Hyun Kim, Yongin-si (KR); Jun Pyo Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/347,623

(22) Filed: Jun. 15, 2021

(65) Prior Publication Data

US 2022/0093036 A1 Mar. 24, 2022

(30) Foreign Application Priority Data

Sep. 23, 2020 (KR) ........................ 10-2020-0123299

(51) Int. Cl.
*G09G 3/32* (2016.01)

(52) U.S. Cl.
CPC ....... *G09G 3/32* (2013.01); *G09G 2300/0408* (2013.01); *G09G 2300/0426* (2013.01); *G09G 2310/0275* (2013.01); *G09G 2310/08* (2013.01)

(58) Field of Classification Search
CPC ... G09G 3/32–3291; G09G 3/36–3696; G09G 2300/04–0408; G09G 2300/0421; G09G 2300/0426; G09G 2310/0243; G09G 2310/0267; G09G 2310/0275; G09G 2310/0281–0286; G09G 2310/06; G09G 2310/061; G09G 2310/067; G09G 2310/08; G09G 2320/0219; G09G 2320/0223; G09G 2320/0252; G09G 2320/066

See application file for complete search history.

(56) References Cited

U.S. PATENT DOCUMENTS

| | | | |
|---|---|---|---|
| 6,835,896 B2 | 12/2004 | Hwang et al. | |
| 9,691,791 B2 | 6/2017 | Jeon et al. | |
| 9,812,084 B2 | 11/2017 | Kim et al. | |
| 10,692,439 B2 | 6/2020 | Kim et al. | |
| 2005/0052442 A1 | 3/2005 | Takenaka et al. | |
| 2014/0139413 A1* | 5/2014 | Kwon | G09G 3/3291 345/82 |
| 2015/0302815 A1* | 10/2015 | Marushima | G09G 3/3677 345/3.2 |

(Continued)

FOREIGN PATENT DOCUMENTS

| | | |
|---|---|---|
| KR | 10-0391843 B1 | 7/2003 |
| KR | 10-2016-0013470 A | 2/2016 |

(Continued)

*Primary Examiner* — Nathan Danielsen
(74) *Attorney, Agent, or Firm* — Innovation Counsel LLP

(57) ABSTRACT

The display device includes a display panel, a printed circuit board on which a timing controller is mounted, and a connection film on which a data driver is mounted. Pixels and a gate driving circuit are disposed in a display area of the display panel. The connection film includes output lines connecting the data driver and the display panel, and first connection lines connecting the printed circuit board and the display panel. The first connection lines overlap the first area on which the data driver is mounted and are disposed between the output lines.

18 Claims, 16 Drawing Sheets

(56) References Cited

U.S. PATENT DOCUMENTS

| | | | |
|---|---|---|---|
| 2016/0019856 A1* | 1/2016 | Tanaka | G09G 3/3666 |
| | | | 345/206 |
| 2016/0197020 A1 | 7/2016 | Lim et al. | |
| 2017/0053617 A1* | 2/2017 | Hong | G09G 3/2096 |
| 2018/0138256 A1* | 5/2018 | Han | G09G 3/20 |
| 2019/0198438 A1 | 6/2019 | Kim et al. | |
| 2019/0245024 A1 | 8/2019 | Lim et al. | |

FOREIGN PATENT DOCUMENTS

| | | |
|---|---|---|
| KR | 10-2016-0015479 A | 2/2016 |
| KR | 10-2019-0046420 A | 5/2019 |

\* cited by examiner

CHIP-ON FILM PACKAGE AND DISPLAY DEVICE INCLUDING THE SAME

CROSS-REFERENCE TO RELATED APPLICATION

This application claims priority to and the benefit of Korean Patent Application No. 10-2020-0123299 filed in the Korean Intellectual Property Office on Sep. 23, 2020, the entire contents of which are incorporated herein by reference.

BACKGROUND

1. Field

The present inventive concept relates to a chip-on film package and a display device including the same.

2. Description of the Related Art

With an increasing interest in information displays and an increasing demand for portable information media, the demand and commercialization of display devices have been focused on.

SUMMARY

An object of the present inventive concept is to provide a chip-on film package capable of minimizing a non-display area of a display device without an increase in manufacturing cost, and a display device including the same.

A display device according to an embodiment of the present inventive concept includes data lines, gate lines, clock lines disposed between the data lines, pixels connected to the data lines and the gate lines in a display area, and a gate driving circuit connected to the clock lines and the gate lines in the display area; a printed circuit board on which a timing controller is mounted; and a connection film on which a data driver is mounted, connecting the timing controller and the data driver, connecting the data driver and the data lines, and connecting the timing controller and the clock lines. The connection film may include a base film including a first area on which the data driver is mounted and a second area surrounding the first area; first input terminals and second input terminals disposed on one side of the base film and connected to the timing controller; first output terminals disposed on another side of the base film and connected to the data lines; second output terminals disposed on the another side of the base film and connected to the clock lines; input lines extending from the first input terminals to the first area; output lines extending from the first output terminals to the first area; and first connection lines overlapping the first area in a plan view and connecting the second input terminals to the second output terminals. The first connection lines may be disposed between the output lines.

In an embodiment, the first connection lines may not cross the input lines and the output lines, and the first connection lines, the input lines, and the output lines may be disposed on a same layer on the base film.

In an embodiment, the first connection lines may overlap the data driver in a plane view and may be electrically separated from the data driver.

In an embodiment, the first connection lines may include a plurality of groups, and the groups may be disposed to be spaced apart from each other with at least one output line interposed therebetween.

In an embodiment, each of the first connection lines includes a pair of first connection lines to which clock signals having a phase difference of 180 degrees are applied and the pair of first connection lines may be disposed adjacent to each other.

In an embodiment, the pair of first connection lines may be disposed between two adjacent output lines and may be spaced apart from other connection lines except for the pair of first connection lines among the first connection lines with at least one output line interposed therebetween.

In an embodiment, the clock lines may include scan clock lines and carry clock lines, the gate driving circuit may include a plurality of stages, each of the stages generates a carry signal using a carry clock signal provided through a corresponding carry clock line among the carry clock lines in response to a start signal or a previous carry signal provided from a previous stage, and generates a scan signal using a scan clock signal provided through a corresponding scan clock line among the scan clock lines, the scan signal is provided to a corresponding one of the gate lines, and the scan clock lines are disposed to be spaced apart from the carry clock lines with at least one data line interposed therebetween.

In an embodiment, the scan clock lines may be disposed adjacent to one side of a corresponding stage among the stages, and the carry clock lines may be disposed adjacent to another side of the corresponding stage among the stages.

In an embodiment, the first connection lines connected to the scan clock lines may be spaced apart from the first connection lines connected to the carry clock lines with at least one output line therebetween.

In an embodiment, the display panel may further include at least one power line connected to the gate driving circuit, and the connection film may further include at least one third input terminal disposed on the one side of the base film and connected to a power supply through the printed circuit board; at least one third output terminal disposed on the another side of the base film and connected to the at least one power line; and at least one second connection line connecting the at least one third input terminal and the at least one third output terminal.

In an embodiment, the at least one second connection line may connect the at least one third input terminal to the at least one third output terminal through the second area of the base film.

In an embodiment, the at least one second connection line may connect the at least one third input terminal to the at least one third output terminal across the first area of the base film.

In an embodiment, the display device may further include a plurality of connection films on which a plurality of data drivers are mounted respectively, and each of the plurality of connection films may connect the timing controller and the data driver, connect the data driver and corresponding data lines among the data lines, and connect the timing controller and corresponding clock lines among the clock lines.

In an embodiment, the display panel may further include power lines connected to the gate driving circuit, each of the connection films may further include third input terminals disposed on one side of the base film and connected to a power supply through the printed circuit board; third output terminals disposed on another side of the base film and connected to the power lines; and second connection lines connecting the third input terminals and the third output terminals, and the first connection lines are disposed between a pair of second connection lines among the second connection lines.

In an embodiment, a pair of first connection lines to which a clock signal having a phase difference of 180 degrees is applied among the first connection lines may be disposed between the pair of second connection lines.

The chip-on film package according to an embodiment of the present inventive concept is electrically connected between two substrates. The chip-on film package may include a base film including a first area on which an integrated circuit is mounted and a second area surrounding the first area; first input terminals and second input terminals disposed on one side of the base film; first output terminals and second output terminals disposed on another side of the base film; input lines extending from the first input terminals to the first area; output lines extending from the first output terminals to the first area; and first connection lines overlapping the first area in a plan view and connecting the second input terminals to the second output terminal. The first connection lines and the output lines are alternately disposed.

In an embodiment, the first connection lines may not cross the input lines and the output lines, and the first connection lines, the input lines, and the output lines may be disposed on a same layer on the base film.

In an embodiment, the first connection lines may include a plurality of groups, and the plurality of groups may be disposed to be spaced apart from each other with the output lines interposed therebetween.

In an embodiment, each of the first connection lines includes a pair of first connection lines to which clock signals having a phase difference of 180 degrees are applied and the pair of first connection lines may be disposed adjacent to each other.

In an embodiment, the pair of first connection lines may be disposed between two adjacent output lines and may be spaced apart from other connection lines except for the pair of first connection lines among the first connection lines with at least one output line interposed therebetween.

The display device according to an embodiment of the present inventive concept may include a gate driving circuit dispersed in a display area of the display panel, and clock lines connected to the gate driving circuit may be disposed between data lines in the display panel. Accordingly, a separate non-display area may be not required on the display panel for disposing the gate driving circuit, and the non-display area of the display panel can be minimized.

In addition, the chip-on-film package may include connection lines that transferring clock signals to clock lines of the display panel from the timing control unit by passing via or through a first area where the data driver is mounted, and the connection lines may not cross the output lines connected to data lines of the display panel. Accordingly, the chip-on film package may include only one conductive layer, and manufacturing cost of the chip-on film package and the display device including the same can be reduced.

Effects of embodiments of the present inventive concept is not limited by what is illustrated in the above, and more various effects are included in the present specification.

DETAILED DESCRIPTION OF THE EMBODIMENTS

Figure 1:
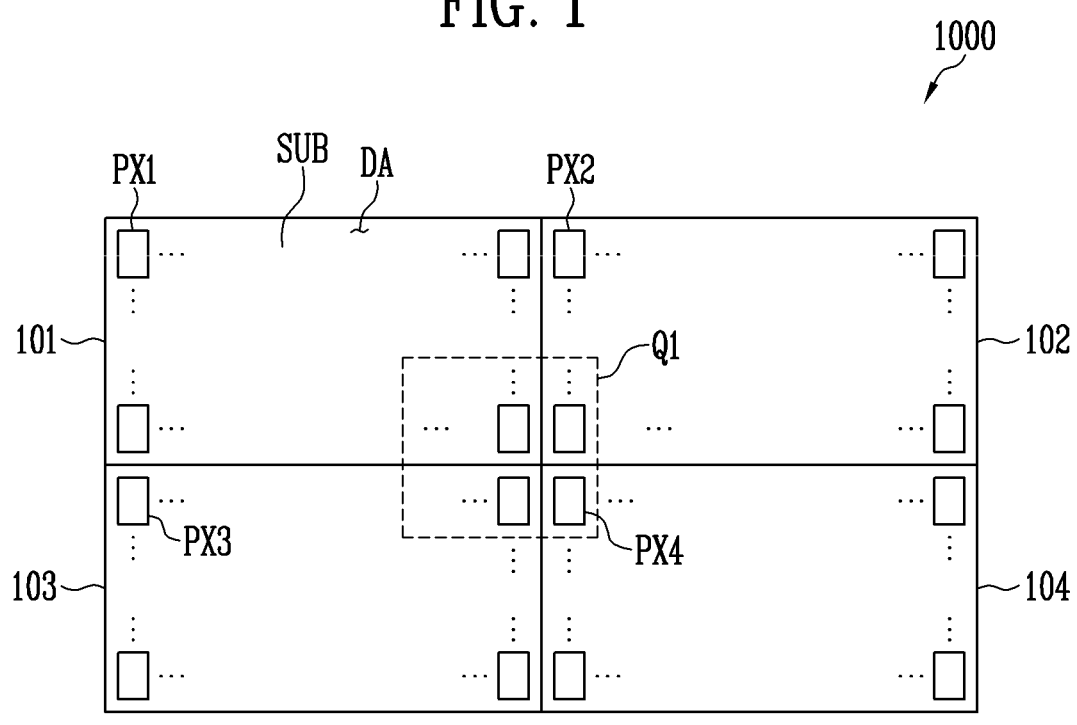
FIG. 1 is a plan view illustrating a display device according to an embodiment.
Figure 1:
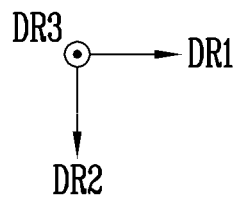

It will be apparent to those skilled in the art that various modifications and variations can be made in the present disclosure without departing from the spirit or scope of the disclosure, and specific embodiments are exemplified in the drawings and explained in the detailed description. Thus, it is intended that the present inventive concept covers the modifications and variations of this inventive concept provided they come within the scope of the present inventive concept and their equivalents.

Like reference numerals designate like elements throughout the specification. In the accompanying drawings, dimensions of structures are exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the word "comprise" or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and include a side direction or a lower direction. In contrast, It will be understood that when an element such as a layer, film, region, or substrate is referred to as being "beneath" another element, it can be directly beneath the other element or intervening elements may also be present.

In the present application, when one component (for example, 'first component') is referred to as being "(operatively or communicatively) coupled with/to" or "connected to" another component (for example, 'second component'), it should be understood that the one component may be directly connected to the another component, or may be connected through another component (for example, 'third component'). On the other hand, when one component (for example, 'first component') is referred to as being "directly coupled" or "directly connected" to another component (for example, 'second component'), it may be understood that no other component (for example, 'third component') exists between the one component and the another component.

Hereinafter, with reference to accompanying drawings, a preferred embodiment of the present inventive concept and others required for those skilled in the art to understand the contents of the present inventive concept will be described in more detail. The terms of a singular form may include plural forms unless referred to the contrary.

Figure 2:
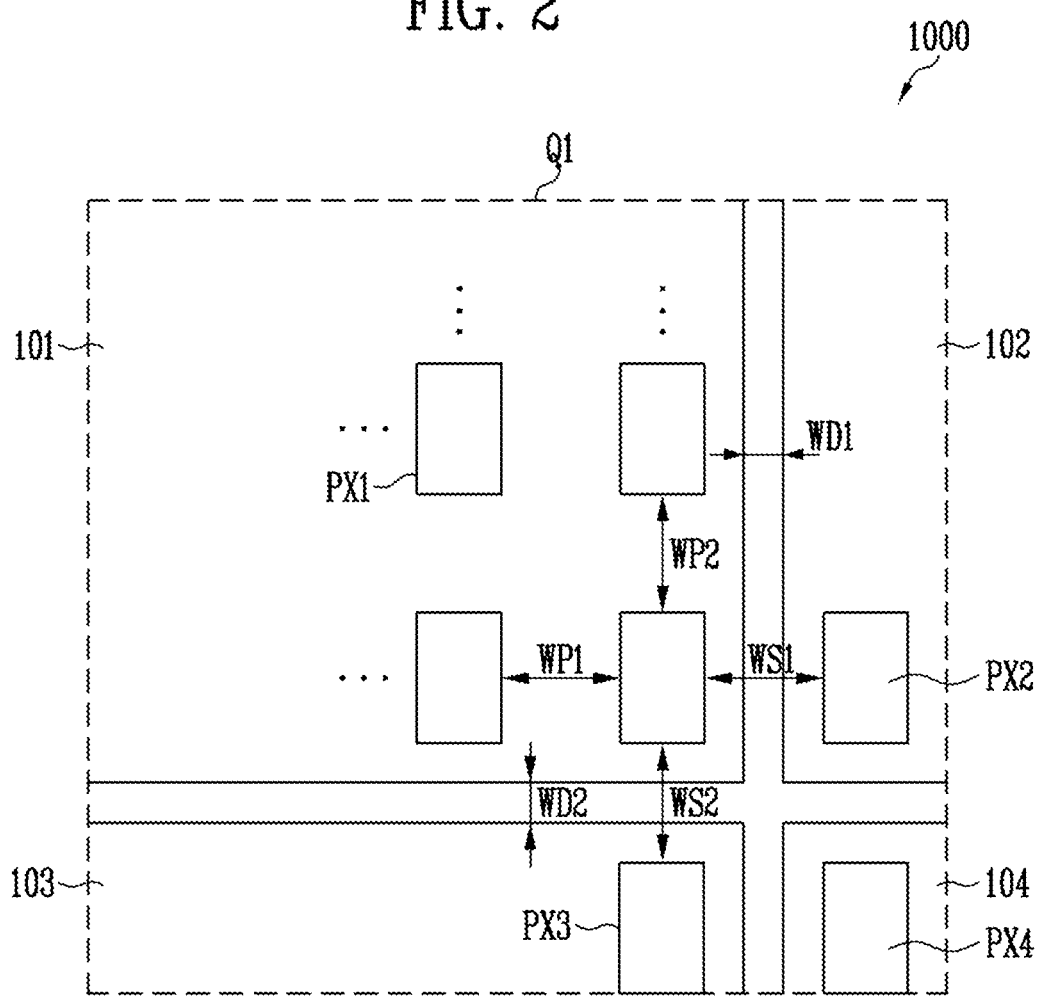
FIG. 2 is an enlarged plan view of an area Q1 of FIG. 1.

FIG. 1 is a plan view illustrating a display device according to an embodiment. FIG. 2 is an enlarged plan view of an area Q1 of FIG. 1.

Referring to FIGS. 1 and 2, a display device 1000 (or tiled display device) may display an image based on image data. The display device 1000 may display an image in a third direction DR3.

The display device 1000 may include a plurality of display panels 100 (or sub-display devices).

The display device 1000 may be formed by connecting two or more display panels 100. In FIG. 1, the display panels 100 are arranged in a 2×2 matrix configuration, but the arrangement and number of the display panels 100 included in the display device 1000 are not limited thereto.

In an embodiment of the present inventive concept, the display panels 100 included in the display device 1000 may be mounted in a chassis in close contact with each other, or may be connected to each other through a separate adhesive.

Although not shown in the drawings, a buffer agent is disposed between the display panels 100 to prevent damage due to collision, but is not limited thereto. For example, a transparent tape or transparent resin may be disposed between the display panels 100 to connect the display panels 100.

At least a gap WD may exist between adjacent display panels. The gap WD is a portion in which the adhesive and/or the buffer agent are exist. When the gap WD between the adjacent display panels 100 is greater than a predetermined distance, a boundary between the display panels 100 is visually recognized, thereby resulting in poor visibility.

Each of the display panels 100 may independently display different images from each other or may display a portion of one image.

In embodiments, the display device 1000 may include a first display panel 101, a second display panel 102, a third display panel 103, and a fourth display panel 104. The display device 1000 may include a plurality of pixels PXL disposed in each of the display panels 100.

The first display panel 101 may include a plurality of pixels PX1 disposed in the display area DA on a substrate SUB. The second display panel 102 may include a plurality of pixels PX2 disposed in the display area DA on a substrate SUB. The third display panel 103 may include a plurality of pixels PX3 disposed in the display area DA on a substrate SUB. The fourth display panel 104 may include a plurality of pixels PX4 disposed in the display area DA on a substrate SUB. The pixel PXL will be described later with reference to FIGS. 3 and 4.

In the display area DA of each of the display panels 100, gate lines and data lines connected to the pixels PXL, and drivers for driving the pixels PXL (for example, a gate driving circuit) and lines (for example, clock lines, power lines, and control lines) may be provided.

In addition, each of the display panels 100 may include a non-display area through which an image is not displayed. The non-display area may be provided on at least one side of the display area DA. The non-display area may have an extremely small area compared to the display area DA and, according to embodiments, the non-display area may not be existed.

In embodiments, a first distance WS1 between the pixels PXL disposed at the outermost sides of adjacent display panels 100 along a first direction may be less than or equal to the first distance WP1 between the pixels PXL in one display panel along the first direction DR1. For example, the first distance WS1 between the pixel PX1 disposed at the outermost side of the first display panel 101 and the pixel PX2 disposed at the outermost side of the second display panel 102 may be less than or equal to the first distance WP1 between the pixels PX1 in the first display panel 101 along a first direction DR1. For example, the second distance WS2 between the pixel PX1 disposed at the outermost side of the first display panel 101 and the pixel PX3 disposed at the outermost side of the third display panel 103 along a second direction DR2 may be less than or equal to a second distance WP2 between the pixels PX1 in the first display panel along the second direction DR2. According to an embodiment, the first distances WS1 along the first direction DR1, the first distance WP1 along the first direction DR1, the second distance WS2 along the second direction DR2 and the second distance WP2 along the second direction DR2 in the display device 1000 may be the same.

In this case, the display panels 100 of the display device 1000 may not be recognized as separate screens to the user, but may be recognized as one screen.

In order to substantially equalize the distance between the pixels PXL of the display device 1000, that is, to minimize a non-display area that may exist at the outermost side of each of the display panels 100, a gate driving circuit for driving the pixels PXL may not be disposed on the non-display area but should be dispersed in the display area DA. The specific arrangement of the gate driving circuit will be described later with reference to FIG. 9.

Figure 3:
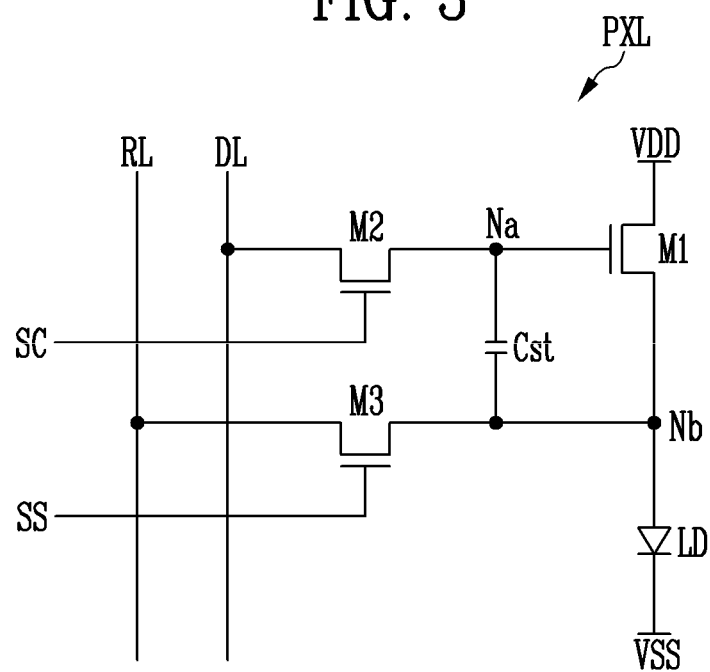
FIG. 3 is a circuit diagram illustrating an example of a pixel included in a display device of FIG. 1.

FIG. 3 is a circuit diagram showing an embodiment of a pixel included in a display device of FIG. 1.

Referring to FIG. 3, the pixel PXL may include first to third thin film transistors M1, M2, and M3 (or switching elements, transistors), a storage capacitor Cst, and a light emitting element LD. The first to third thin film transistors M1, M2, and M3 may be N-type transistors. However, the first to third thin film transistors M1, M2, and M3 may be P-type transistors.

In the first thin film transistor M1, a gate electrode may be connected to a gate node Na, one electrode (or first electrode) may be connected to a first power line VDD (or first power source), and the other electrode (or second electrode) may be connected to a source node Nb. The first thin film transistor M1 may be referred to as a driving transistor.

In the second thin film transistor M2, a gate electrode may be connected to a scan line SC (or first gate line), one electrode may be connected to a data line DL, and the other electrode may be connected to the gate node Na. The second thin film transistor M2 may be referred to as a switching transistor, a scan transistor, or the like. The scan line SC may be connected to a gate driving circuit to be described later with reference to FIG. 6. The data line DL may be connected to a data driver to be described later with reference to FIG. 5.

In the third thin film transistor M3, a gate electrode may be connected to a sensing scan line SS (or second gate line), one electrode may be connected to a sensing line RL, and the other electrode may be connected to the source node Nb. The third thin film transistor M3 may be referred to as an initialization transistor, a sensing transistor, or the like. The sensing scan line SS may be connected to a gate driving circuit to be described later with reference to FIG. 6. The sensing lines RL may be arranged in pairs with the data lines DL and may be connected to a data driver to be described later with reference to FIG. 5. According to an embodiment, the sensing line RL and the third thin film transistor M3 may be omitted.

In the storage capacitor Cst, one electrode may be connected to the gate node Na, and the other electrode may be connected to the source node Nb.

In the light emitting element LD, an anode may be connected to the source node Nb, and a cathode may be connected to a second power line VSS (or second power source). The light emitting element LD may be a light emitting diode having a size as small as a nano-scale or micro-scale as an example of a micro-sized element using a material having an inorganic crystal structure. The light emitting element LD may be a micro light emitting diode manufactured by an etching method or a micro light emitting diode manufactured by a growth method. However, the light emitting element LD is not limited thereto, and the light emitting element LD may be an organic light emitting diode.

A first power voltage may be supplied by the first power line VDD, and a second power voltage may be supplied by the second power line VSS. The first and second power voltages may be voltages required for the operation of the pixel PXL, and the first power voltage may have a voltage level higher than that of the second power voltage.

A scan signal (or first scan pulse) having a turn-on voltage level may be applied to the scan line SC, and a sensing scan signal (or first sensing scan pulse) having a turn-on voltage level may be applied to the sensing scan line SS. Also, a data signal corresponding to a specific grayscale value may be applied to the data line DL.

In this case, the second thin film transistor M2 may be turned on in response to the scan signal, and a data signal may be supplied by one electrode of the storage capacitor Cst. In addition, the third thin film transistor M3 may be turned on in response to the sensing scan signal, and a first reference voltage applied to the sensing line RL may be provided to the other electrode of the storage capacitor Cst. Accordingly, a voltage corresponding to a difference between the data signal and the first reference voltage may be stored in the storage capacitor Cst. Thereafter, when the second thin film transistor M2 and the third thin film transistor M3 are turned off, an amount of driving current flowing through the first thin film transistor M1 may be determined according to a voltage stored in the storage capacitor Cst, and the light emitting element LD may emit light with luminance corresponding to the amount of driving current.

On the other hand, since the scan signal for writing data in the pixel PXL and the sensing scan signal for emitting the pixel PXL have the same waveform, the scan signal applied to the scan line SC may also be applied to a sensing scan line SS as the sensing scan signal according to an embodiment.

Figure 4:
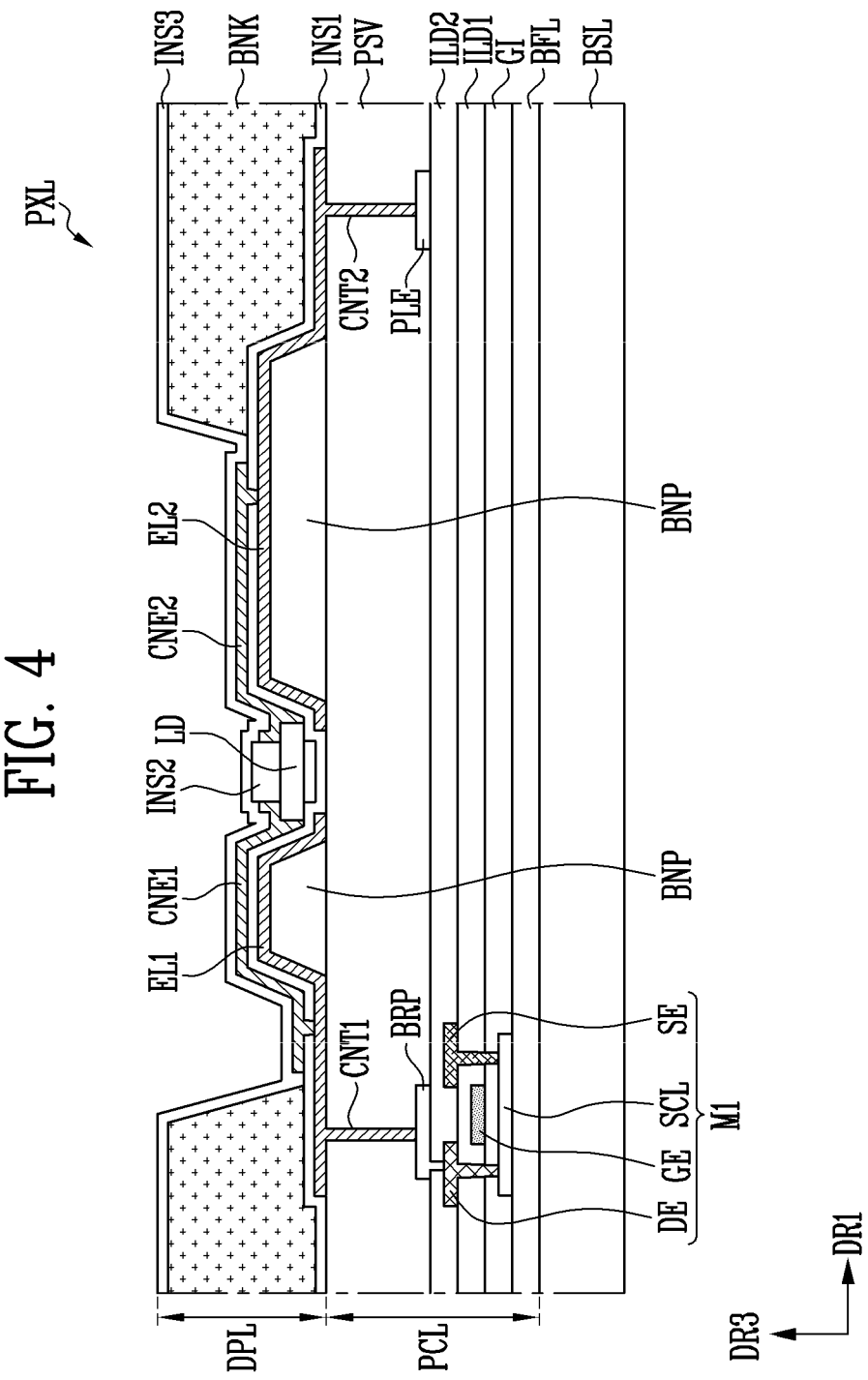
FIG. 4 is a cross-sectional view illustrating an example of the pixel of FIG. 3.

FIG. 4 is a cross-sectional view illustrating an example of the pixel of FIG. 3.

Referring to FIG. 4, the pixel PXL may include a base layer BSL, a pixel circuit layer PCL, and a display element layer DPL. Since the first to third thin film transistors M1, M2, and M3 shown in FIG. 3 have substantially the same or similar structure to each other, for convenience of description, only the first thin film transistor M1 among the first to third thin film transistors M1, M2 and M3 is shown in FIG. 4.

The base layer BSL may be a rigid or flexible substrate. For example, the base layer BSL may include a rigid material or a flexible material. The base layer BSL may correspond to the substrate SUB described with reference to FIG. 1.

The pixel circuit layer PCL may be disposed on the base layer BSL, and may include a buffer layer BFL, a first thin film transistor M1, a gate insulating layer GI, a first interlayer insulating layer ILD1, and a second interlayer insulating layer ILD2, a bridge pattern BRP, a power line PLE, a first contact hole CNT1, a second contact hole CNT2, and a passivation layer PSV.

The buffer layer BFL may be disposed on the base layer BSL. The buffer layer BFL may prevent impurities from being diffused from the outside. The buffer layer BFL may include at least one of metal oxides such as silicon nitride (SiNx), silicon oxide (SiOx), silicon oxynitride (SiOxNy), aluminum oxide (AlOx), and the like.

The first thin film transistor M1 may include a semiconductor layer SCL, a gate electrode GE, a source electrode SE (or second electrode), and a drain electrode DE (or first electrode).

The semiconductor layer SCL may be disposed on the buffer layer BFL. The semiconductor layer SCL may include an oxide semiconductor. However, the semiconductor layer SCL is not limited thereto, and the semiconductor layer SCL may include polysilicon or amorphous silicon.

The semiconductor layer SCL may include a first contact region in contact with the source electrode SE and a second contact region in contact with the drain electrode DE.

The first contact region and the second contact region may be a semiconductor pattern doped with impurities. A region between the first contact region and the second contact region may be a channel region. The channel region may be an intrinsic semiconductor that is not doped with impurities.

The gate insulating layer GI may be provided on the semiconductor layer SCL. The gate insulating layer GI may include an inorganic material. According to an embodiment, the gate insulating layer GI may include at least one of silicon nitride (SiNx), silicon oxide (SiOx), silicon oxynitride (SiOxNy), and aluminum oxide (AlOx). According to an embodiment, the gate insulating layer GI may include an organic material.

The gate electrode GE may be disposed on the gate insulating layer GI. The position of the gate electrode GE may correspond to the position of the channel region of the semiconductor layer SCL. For example, the gate electrode GE may be disposed on the channel region of the semiconductor layer SCL with the gate insulating layer GI interposed therebetween.

The first interlayer insulating layer ILD1 may be disposed on the gate electrode GE. Like the gate insulating layer GI, the first interlayer insulating layer ILD1 may include at least one of silicon nitride (SiNx), silicon oxide (SiOx), silicon oxynitride (SiOxNy), and aluminum oxide (AlOx).

The source electrode SE and the drain electrode DE may be disposed on the first interlayer insulating layer ILD1. The source electrode SE may penetrate the gate insulating layer GI and the first interlayer insulating layer ILD1 to contact the first contact region of the semiconductor layer SCL, and the drain electrode DE may penetrate the gate insulating layer GI and the first interlayer insulating layer ILD1 to contact the second contact region of the semiconductor layer SCL.

The second interlayer insulating layer ILD2 may be disposed on the source electrode SE and the drain electrode DE. Like the first interlayer insulating layer ILD1 and the gate insulating layer GI, the second interlayer insulating layer ILD2 may include an inorganic material. The inorganic material may include materials exemplified as constituent materials of the first interlayer insulating film ILD1 and the gate insulating film GI, for example, at least one of silicon nitride (SiNx), silicon oxide (SiOx), silicon oxynitride (SiOxNy), and aluminum oxide (AlOx). According to an embodiment, the second interlayer insulating layer ILD2 may include an organic material.

The bridge pattern BRP may be disposed on the second interlayer insulating layer ILD2. The bridge pattern BRP may be electrically connected to the drain electrode DE through a contact hole penetrating the second interlayer insulating layer ILD2.

The power line PLE may be disposed on the second interlayer insulating layer ILD2. The power line PLE may be the second power line VSS described above with reference to FIG. 3, and the second power voltage may be supplied to the power line PLE.

The passivation layer PSV may be disposed on the second interlayer insulating layer ILD2 on the bridge pattern BRP and the power line PLE. The passivation layer PSV may cover the bridge pattern BRP and the power line PLE.

The passivation layer PSV may be provided in a form including an organic insulation layer, an inorganic insulation layer, or the organic insulation layer disposed on the inorganic insulation layer.

The passivation layer PSV may include a first contact hole CNT1 electrically connected to one region of the bridge pattern BRP and a second contact hole CNT2 electrically connected to one region of the power line PLE.

The display element layer DPL may be disposed on the pixel circuit layer PCL, and may include a bank pattern BNP, a first electrode EL1, a second electrode EL2, a first insulating layer INS1, a bank BNK, and light emitting element LD, a second insulating layer INS2, a first contact electrode CNE1, a second contact electrode CNE2, and a third insulating layer INS3.

The bank pattern BNP may have a shape protruding upward, and the first electrode EL1 and the second electrode EL2 may be disposed on the bank pattern BNP to form a reflective partition wall. Since the reflective partition wall is formed, light efficiency of light emission from the light emitting element LD in the third direction DR3 may be improved.

The first electrode EL1 may be disposed on the passivation layer PSV and the bank pattern BNP. The first electrode EL1 may be a path through which the voltage of the first power line VDD described above with reference to FIG. 3 is applied through the first thin film transistor M1 and may be a path to which electrical information on the light emitting element LD may be provided.

The second electrode EL2 may be disposed on the passivation layer PSV and the bank pattern BNP. The second electrode EL2 may be a path through which the voltage of the second power line VSS described above with reference to FIG. 3 may be applied.

The first electrode EL1 and the second electrode EL2 may reflect light emitted from the light emitting element LD in the third direction DR3 (or display direction) so that light emitting efficiency of the light emitting element LD is improved.

The first insulating layer INS1 may be disposed on the passivation layer PSV on the first electrode EL1 and the second electrode EL2. Like the second interlayer insulating layer ILD2, the first insulating layer INS1 may include at least one of silicon nitride (SiNx), silicon oxide (SiOx), silicon oxynitride (SiON), and aluminum oxide (AlOx).

At least a portion of the first insulating layer INS1 may be disposed between the first contact electrode CNE1 and the first electrode EL1 and between the second contact electrode CNE2 and the second electrode EL2 to stabilize electrical connection and attenuate external influences.

The bank BNK may be disposed on the first insulating layer INS1 (or pixel circuit layer PCL). The bank BNK may be a structure defining a light emitting area of the pixel PXL. The light emitting area may mean an area in which light is emitted from the light emitting element LD. For example, the bank BNK may be disposed to surround the light emitting element LD of the pixel PXL and may be disposed in a boundary area between adjacent pixels PXL.

The light emitting element LD may be disposed on the first insulating layer INS1. The light emitting element LD may be disposed on the first insulating layer INS1 between the first electrode EL1 and the second electrode EL2. The light emitting element LD may be a light emitting diode having a size as small as nanoscale or microscale.

In an embodiment, the light emitting element LD may include a first semiconductor layer, a second semiconductor layer, an active layer, and an insulating layer. The first semiconductor layer may include a semiconductor layer having a predetermined type, and the second semiconductor layer may include a semiconductor layer of a different type from the first semiconductor layer. For example, the first semiconductor layer may include an N-type semiconductor layer, and the second semiconductor layer may include a P-type semiconductor layer. The first semiconductor layer and the second semiconductor layer may include at least one semiconductor material of InAlGaN, GaN, AlGaN, InGaN, AlN, and InN. The active layer may be disposed between the first semiconductor layer and the second semiconductor layer. The active layer may have a single or multiple quantum well structure. When an electric field of a predetermined voltage or more is applied to both ends of the light emitting element LD, electron-hole pairs may be coupled in the active layer to emit light. The insulating layer may cover an outer circumferential surface of the light emitting element LD except for both ends of the light emitting element LD, and may prevent the active layer from contacting a conductor outside the light emitting element LD.

The second insulating layer INS2 may be disposed on the light emitting element LD. The second insulating layer INS2 may be formed to cover an area corresponding to the active layer of the light emitting element LD. The second insulating layer INS2 may include at least one of an organic material or an inorganic material.

According to an embodiment, at least a portion of the second insulating layer INS2 may be disposed under the light emitting element LD. When a gap is formed between the light emitting element LD and the first insulating layer INS1, the second insulating layer INS2 may fill a gap between the first insulating layer INS1 and the light emitting element LD while the second insulating layer INS2 is formed on the light emitting element LD.

The first contact electrode CNE1 and the second contact electrode CNE2 may be disposed on the first insulating layer INS1 on the light emitting element LD and the second insulating layer INS2. The first contact electrode CNE1 and the second contact electrode CNE2 may be electrically connected to the first electrode EL1 and the second electrode EL2 through a contact hole (or opening) formed in the first insulating layer INS1, respectively.

The first contact electrode CNE1 and the second contact electrode CNE2 may include at least one of transparent conductive materials including indium tin oxide (ITO), indium zinc oxide (IZO), and indium tin zinc oxide (ITZO).

An electrical signal provided through the first electrode EL1 may be provided to the light emitting element LD through the first contact electrode CNE1, and an electrical signal provided through the second electrode EL2 may be provided to the light emitting element LD through the second contact electrode CNE2, and the light emitting element LD may emit light based on the provided electrical signal.

The third insulating layer INS3 may be disposed on the bank BNK, the first contact electrode CNE1, the second contact electrode CNE2, and the second insulating layer INS2. The third insulating layer INS3 may include at least one of an organic material or an inorganic material. The third insulating layer INS3 may protect the display element layer DPL from external influences.

According to an embodiment, a color conversion layer and/or a color filter may be disposed on the third insulating layer INS3.

The color conversion layer may include color conversion particles corresponding to a specific color. The color conversion layer may include color conversion particles that convert light of a first color emitted from the light emitting element LD disposed in the pixel PXL into light of a second color (or specific color). For example, when the light emitting element LD emits light having a blue color, the color conversion layer may include quantum dot color conversion particles that convert light emitted from the light emitting element LD into red light or blue light.

The color filter may selectively transmit light (i.e., light converted to a specific color) emitted from the color conversion layer. The color filter may include a red color filter, a green color filter, and a blue color filter.

Figure 5:
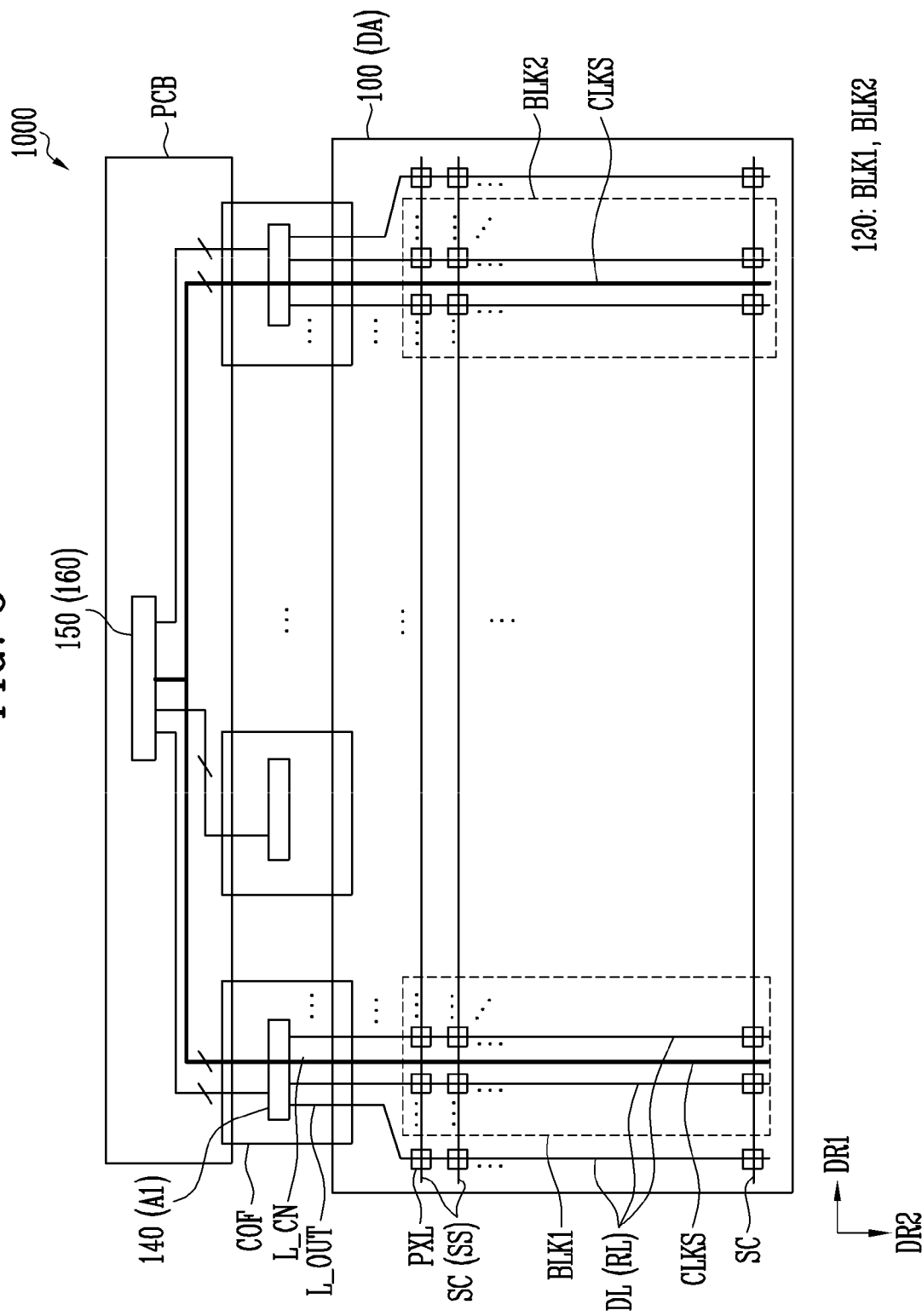
FIG. 5 is a plan view illustrating an example of the display device of FIG. 1.

FIG. 5 is a plan view illustrating an example of the display device of FIG. 1. Since the display panels 100 shown in FIG. 1 are substantially the same as or similar to each other, for convenience of description, the display device 1000 in FIG. 5 is schematically shown focusing on one display panel 100.

Referring to FIGS. 1 to 5, the display device 1000 may include a display panel 100, a timing controller 150, a printed circuit board PCB, a data driver 140, and a connection film COF (or chip-on film package). The display device 1000 may further include a power supply 160 (for example, a power management integrated circuit (PMIC)).

The display panel 100 may include scan lines SC (and sensing scan lines SS), data lines DL (and sensing lines RL) and pixels PXL provided in the display area DA.

The scan lines SC may extend in the first direction DR1 and may be sequentially arranged in the second direction DR2. The data lines DL may extend in the second direction DR2 and may be sequentially arranged in the first direction DR1. The pixels PXL may be respectively disposed in areas where the scan lines SC and the data lines DL intersect or may be respectively disposed in areas defined by the scan lines SC and the data lines DL. Each of the pixels PXL may include the light emitting element LD described with reference to FIGS. 3 and 4 and a pixel circuit for driving the pixels PXL. Each of the pixels PXL illustrated in FIG. 5 may correspond to an area in which the pixel circuit is disposed.

In embodiments, the display panel 100 may further include a gate driving circuit 120 disposed in the display area DA. The gate driving circuit 120 may receive a gate control signal from the timing controller 150, may generate scan signals (or gate signals) based on the gate control signal, and may provide the scan signals to scan lines SC (and sensing scan lines SS). For example, the gate driving circuit 120 may generate scan signals using clock signals and start signals (or start pulses) included in the gate control signal.

The gate driving circuit 120 may be dispersed in the display area DA. For example, the gate driving circuit 120 may include a plurality of transistors and at least one capacitor, and the transistors and the at least one capacitor may be dispersed between the pixels PXL in the display area DA. The transistors and at least one capacitor of the gate driving circuit 120 may be formed at the same time using the same process as the first thin film transistor M1 described with reference to FIG. 4.

In embodiments, the gate driving circuit 120 may include a plurality of blocks BLK1 and BLK2. As shown in FIG. 5, the gate driving circuit 120 may include a first block BLK1 disposed at one side of the display panel 100 in the first direction DR1 and a second block BLK2 disposed at the other side of the display panel 100 in the first direction of DR1. Each of the first block BLK1 and the second block BLK2 may be connected to the scan lines SC and may provide scan signals to the scan lines SC at the same timing. Since the scan signals are provided from left and right sides of the display panel 100 by the first block BLK1 and the second block BLK2, delay and attenuation of the scan signals due to the load of the scan lines SC may be alleviated. However, the gate driving circuit 120 is not limited thereto, and the gate driving circuit 120 may include one block or three or more blocks. That is, one gate driving circuit 120 or a plurality of gate driving circuits 120 may be provided in the display panel 100.

In embodiments, the display panel 100 may further include clock lines CLKS (and power lines and control lines). The clock lines CLKS may extend in the second direction DR2 and may be arranged in the first direction DR1. The clock lines CLKS may be connected to the gate driving circuit 120, and clock signals required for driving the gate driving circuit 120 may be supplied by the clock lines CLKS. Power voltages required for driving the gate driving circuit 120 (for example, a turn-on voltage for turning on an internal transistor, a turn-off voltage for turning off an internal transistor) are supplied by the power lines, and control signals (for example, a start signal (or start pulse), a reset signal for initializing or resetting the gate driving circuit 120, a selection signal for outputting a scan signal only to a specific scan line SC, and the like) for controlling the operation of the gate driving circuit 120 may be supplied by the control lines.

At least some of the clock lines CLKS may be disposed between the data lines DL. That is, the clock lines CLKS and the data lines DL may be alternately disposed in the display area DA.

The timing controller 150 may control the gate driving circuit 120 and the data driver 140. The timing controller 150 may receive a control signal (for example, control signal including an external clock signal) from the external device such as a graphic controller and may generate a gate control signal and a data control signal based on the control signal. The timing controller 150 may provide a gate control signal to the gate driving circuit 120 and a data control signal to the data driver 140.

In addition, the timing controller 150 may rearrange input data (or raw image data) provided from the external (for example, graphic processor) to generate image data, and may provide the image data to the data driver 140. The timing controller 150 may be mounted on the printed circuit board PCB (or control board).

The power supply 160 may generate power voltages required for driving the gate driving circuit 120 and the data driver 140. The power supply 160 may be mounted on the printed circuit board PCB or may be connected to the gate driving circuit 120 and the data driver 140 through the printed circuit board PCB.

The data driver 140 may receive a data control signal and image data from the timing controller 150 and may generate data signals corresponding to the image data. The data driver 140 may provide data signals to the display panel 100 through data lines DL. The data driver 140 may be implemented as an integrated circuit and mounted on a first area A1 of the connection film COF (or data drive circuit film, flexible circuit substrate), and may be connected to the timing controller 150 through a line formed on the printed circuit board PCB.

When the display device 1000 includes a plurality of data driver 140, each of the data driver 140 may be mounted on each of a plurality of connection films COF and connected to the timing controller 150. For example, when the display panel 100 includes 7,680 pixels PXL or data lines DL in the first direction DR1, the display device 1000 may include 24 data drivers 140 mounted on 24 connection films COF, respectively, and each of the 24 data drivers 140 may be connected to corresponding 320 data lines DL.

In embodiments, the connection film COF may include output lines L_OUT and connection lines L_CN (or routing lines). The output lines L_OUT may extend from the first area A1 on which the data driver 140 is mounted to the other end of the connection film COF connected to the display panel 100 and may provide or transfer data signals from the data driver 140 to the data lines DL in the display panel 100.

The connection lines L_CN may extend from one end of the connection film COF connected to the printed circuit board PCB to the other end of the connection film COF via or through the first area A1. The connection lines L_CN may overlap the data driver 140 in a plane view, but may be electrically separated from the data driver 140. For example, in a plan view, the connection lines L_CN may be disposed between bumps of the data driver 140 which are provided to electrically connect the connection film COF to the data driver 140.

The connection lines L_CN may be connected to the clock lines CLKS of the display panel 100 and may provide or transfer clock signals from the timing controller 150 to the clock lines CLKS of the display panel 100. According to an embodiment, some of the connection lines L_CN may be connected to the control lines and the power lines of the display panel 100, may provide the control signals from the timing controller 150 to the control lines in the display panel 100, and may provide the power voltages from the power supply 160 to the power lines in the display panel 100.

In embodiments, the connection lines L_CN may not cross the output lines L_OUT. For example, the connection lines L_CN and the output lines L_OUT may be formed on the same layer in the connection film COF through the same process. In this case, the connection film COF may require only one conductive layer including the connection lines L_CN and the output lines L_OUT.

For reference, a general display panel may include a gate driving circuit formed in a non-display area disposed on one side (for example, one side in the first direction DR1) of the display area, and connection lines (i.e., connection lines for transferring clock signals to the gate driving circuit) of a general connection film may be disposed at one side of the general connection film in the first direction DR1. Since the gate driving circuit 120 according to the embodiments of the present inventive concept is formed in the display area DA of the display panel 100, the connection lines in the connection film must be disposed between the output lines L_OUT. However, when the connection lines in the connection film are disposed to cross the output lines L_OUT to dispose the connection lines between the output lines L_OUT, the connection film may require an additional conductive layer for forming bridge lines in an area where the connection lines and the output lines L_OUT cross. That is, the connecting film may require two or more conductive layers so that manufacturing cost of the connecting film may be increased.

Accordingly, in the connection film COF according to the embodiments of the present inventive concept, the connection lines L_CN may be disposed so as to pass through the first area A1 on which the data driver 140 is mounted, so that the connection lines L_CN may be disposed between the output lines L_OUT without crossing the output lines L_OUT.

A more specific configuration of the connection film COF and the connection lines L_CN will be described later with reference to FIG. 11.

As described with reference to FIG. 5, the gate driving circuit 120 may be dispersed in the display area DA of the display panel 100, and clock lines CLKS (and control lines) connected to the gate driving circuit 120 may be disposed between the data lines DL in the display panel 100. Accordingly, a separate non-display area for arranging the gate driving circuit 120 is not required in the display panel 100, so a non-display area of the display panel 100 can be minimized.

In addition, the connection film COF may include the connection lines L_CN that pass through the first area A1 on which the data driver 140 is mounted and transfer clock signals from the timing controller 150 to the clock lines CLKS of the display panel 100, and the connection lines L_CN may not cross the output lines L_OUT connected to the data lines DL of the display panel 100. Accordingly, the connection film COF may include only one conductive layer, and manufacturing cost of the connection film COF (and the display device 1000 including the same) may be reduced.

Figure 6:
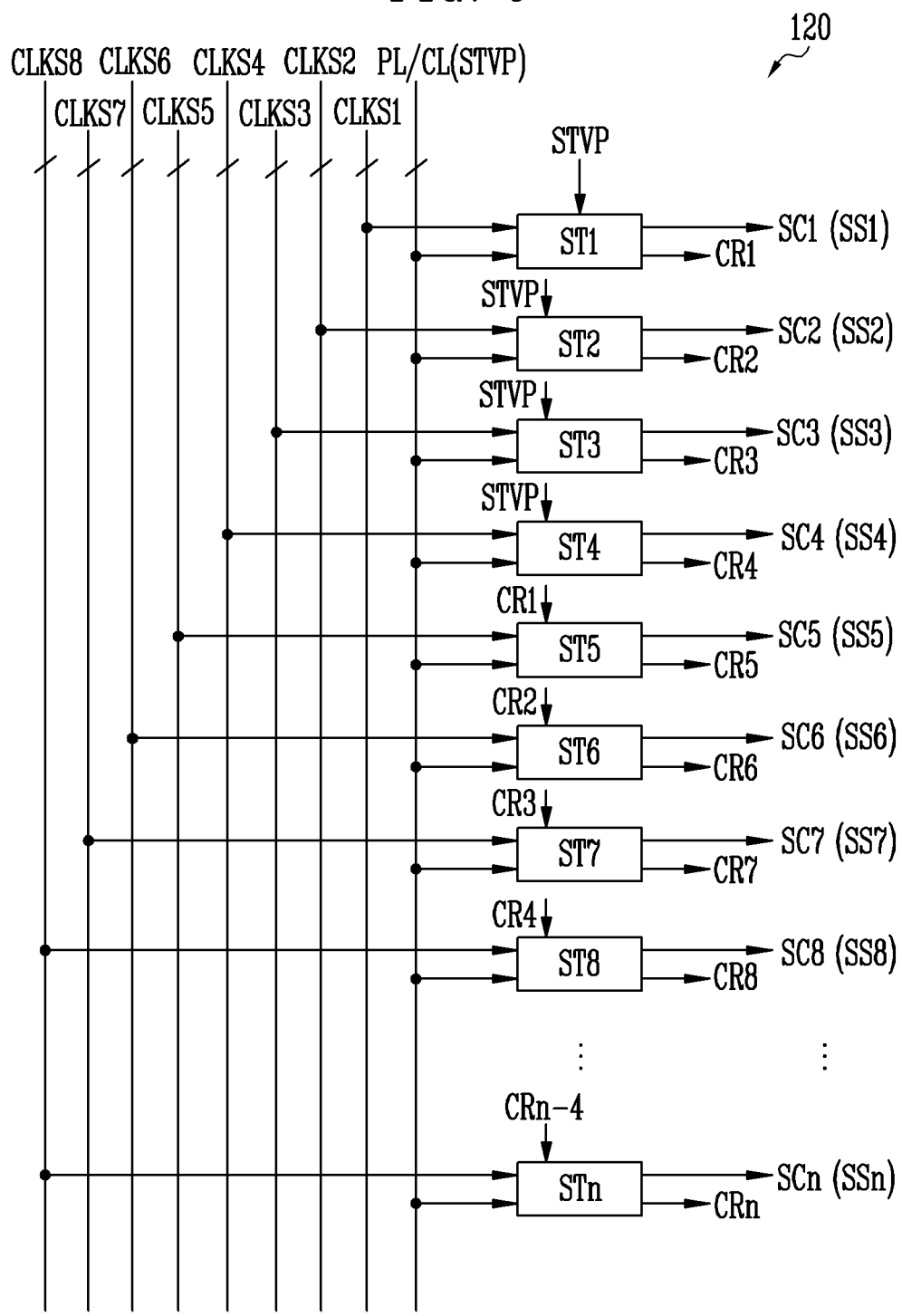
FIG. 6 is a block diagram illustrating a gate driving circuit included in the display device of FIG. 5.
Figure 7:
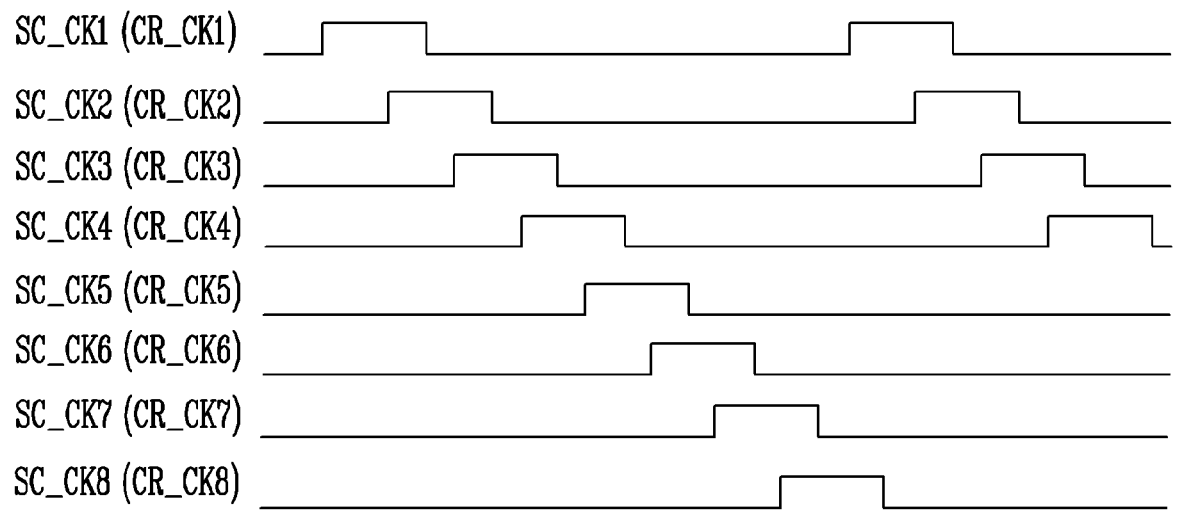
FIG. 7 is a waveform diagram illustrating an example of clock signals used in the gate driving circuit of FIG. 6.

FIG. 6 is a block diagram illustrating a gate driving circuit included in the display device of FIG. 5. FIG. 7 is a waveform diagram illustrating an example of clock signals used in the gate driving circuit of FIG. 6.

Referring to FIGS. 5 to 7, the gate driving circuit 120 may include a plurality of stages ST1 to STn (here, n is a positive integer). Each of the first and second blocks BLK1 and BLK2 described with reference to FIG. 5 may include a plurality of stages ST1 to STn.

The stages ST1 to STn may be connected to the scan lines SC1 to SCn (and the sensing scan lines SS1 to SSn), respectively. The scan lines SC1 to SCn and the sensing scan lines SS1 to SSn may respectively correspond to the scan line SC and the sensing scan line SS described with reference to FIG. 3.

Additionally, the stages ST1 to STn may be connected to corresponding clock lines among a plurality of clock lines CLKS1 to CLKS8. Also, the stages ST1 to STn may be commonly connected to the power lines PL and the control lines CL. Power voltages required for driving each of the stages ST1 to STn may be supplied by the power lines PL, and control signals for controlling driving of each of the stages ST1 to STn may be supplied by the control lines CL. According to an embodiment, when a start signal is used as a reset signal for simultaneously initializing or resetting the stages ST1 to STn, the control lines CL may include a start signal line STVP through which the start signal is supplied.

The clock lines may include first clock lines CLKS1 to eighth clock lines CLKS8, and each of the first clock lines CLKS1 to the eighth clock lines CLKS8 may include a scan clock line and a carry clock line to be described later with reference to FIG. 8. However, this is just an example, and the number of the clock lines CLKS1 to CLKS8 is not limited thereto, and for example, the clock lines may include only the first clock lines CLKS1 to the sixth clock line CLKS6, may not include the seventh clock lines CLKS7 and the eighth clock lines CLKS8.

Clock signals applied to the first to eighth clock lines CLKS1 to CLKS8 may have different phases. As shown in FIG. 7, first to eighth scan clock signals SC_CK1 to SC_CK8 (and first to eighth carry clock signals CR_CK1 to CR_CK8) respectively applied to the first to eighth clock lines CLKS1 to CLKS8 may have the same period as each other but may have a specific phase difference (for example, a phase difference of ⅛ of the period). For example, the second scan clock signal SC_CK2 may have a phase delayed from that of the first scan clock signal SC_CK1. Meanwhile, some of the first to eighth scan clock signals SC_CK1 to SC_CK8 may have waveforms that are complementary to the rest of the first to eighth scan clock signals SC_CK1 to SC_CK8 (or a phase difference by 180 degrees or by half a period). For example, in an interval in which the first scan clock signal SC_CK1 has a logic low level (or first voltage level, turn-off voltage level), the fifth scan clock signal SC_CK5 may have a logic high level (or second voltage level, turn-on voltage level), and in an interval in which the fifth scan clock signal SC_CK5 has a logic low level, the first scan clock signal SC_CK1 may have a logic high level. That is, the first scan clock signal SC_CK1 and the fifth scan clock signal SC_CK5 may have waveforms that are complementary to each other. Similarly, the second scan clock signal SC_CK2 and the sixth scan clock signal SC_CK6 may have waveforms that are complementary to each other, the third scan clock signal SC_CK3 and the seventh scan clock signal SC_CK7 may have waveforms that are complementary to each other, and the fourth scan clock signal SC_CK4 and the eighth scan clock signal SC_CK8 may have waveforms that are complementary to each other. As described later, when the first to eighth clock lines CLKS1 to CLKS8 are disposed in the display area DA (refer to FIG. 1), the clock signals (for example, a pulse having a voltage level of about 25V to 30V) applied to the first to eighth clock lines CLKS1 to CLKS8 may affect the pixel PXL as noise. In order to alleviate or prevent such an effect, the clock lines CLKS1 to CLKS8 to which clock signals having complementary waveforms are applied may be arranged in a pair.

Each of the first to eighth carry clock signals CR_CK1 to CR_CK8 may have the same waveform as a corresponding scan clock signal among the first to eighth scan clock signals SC_CK1 to SC_CK8 or may have different waveforms therefrom.

The first stage ST1 may be connected to the first clock lines CLKS1, the second stage ST2 may be connected to the second clock lines CLKS2, the third stage ST3 may be connected to the third clock lines CLKS3, the fourth stage ST4 may be connected to the fourth clock lines CLKS4, the fifth stage ST5 may be connected to the fifth clock lines CLKS5, the sixth stage ST6 may be connected to the sixth clock lines CLKS6, the seventh stage ST7 may be connected to the seventh clock lines CLKS7, and the eighth stage ST8 may be connected to the eighth clock lines CLKS8. Similar to the first to eighth stages ST1 to ST8, stages after the eighth stage ST8 may be connected to corresponding clock lines among the first to eighth clock lines CLKS1 to CLKS8. The n-th stage STn and the eighth stage ST8 may be connected to the eighth clock lines CLKS8.

In embodiments, each of the stages ST1 to STn may shift the start signal provided through the start signal line STVP or the previous carry signal provided from the previous stage using the clock signals to generate the carry signal and the scan signal (and sensing scan signal).

For example, the first stage ST1 may shift the start signal by using first clock signals (for example, first carry clock signal CR_CK1 and first scan clock signal SC_CK1) provided through the first clock line CLKS1 to generate a first carry signal CR1 and a first scan signal SC1 (and a first sensing scan signal SS1). The first carry signal may be provided to the first carry line CR1, and the first scan signal may be provided to the first scan line SC1. The fifth stage ST5 may shift the first carry signal provided from the first stage ST1 (i.e., previous stage of the fifth stage ST5) by using the fifth clock signals (for example, the fifth carry clock signal CR_CK5 and the fifth scan clock signal SC_CK5) provided through the fifth clock line CLKS5 to generate a fifth carry signal CR5 and a fifth scan signal SC5 (and a fifth sensing scan signal SS5). The fifth carry signal may be provided to the fifth carry line CR5, and the fifth scan signal may be provided to the fifth scan line SC5. Similar to the fifth stage ST5, the sixth stage ST6 may shift the second carry signal (i.e., second carry signal provided through the second carry line CR2) provided from the second stage ST2 (i.e., previous stage of the sixth stage ST6) by using the sixth clock signals (for example, sixth carry clock signal CR_CK6 and sixth scan clock signal SC_CK6) provided through the sixth clock line CLKS6 to generate a sixth carry signal CR6 and a sixth scan signal SS6 (and a sixth sensing scan signal SS6). The sixth carry signal may be provided to the sixth carry line CR6, and the sixth scan signal may be provided to the sixth scan line SC6. The n-th stage STn may shift the n−4-th carry signal (i.e., n−4-th carry signal provided through the n−4-th carry line CRn−4) provided from the n−4-th stage (i.e., previous stage of the n-th stage STn) by using the eighth clock signals (for example, eighth carry clock signal CR_CK8 and eighth scan clock signal SC_CK8) provided through the eighth clock line CLKS8 to generate an n-th carry signal CRn and an n-th scan signal SCn (and an n-th sensing scan signal SSn). The n-th carry signal may be provided to the n-th carry line CRn, and the n-th scan signal may be provided to the n-th scan line SCn.

Figure 8:
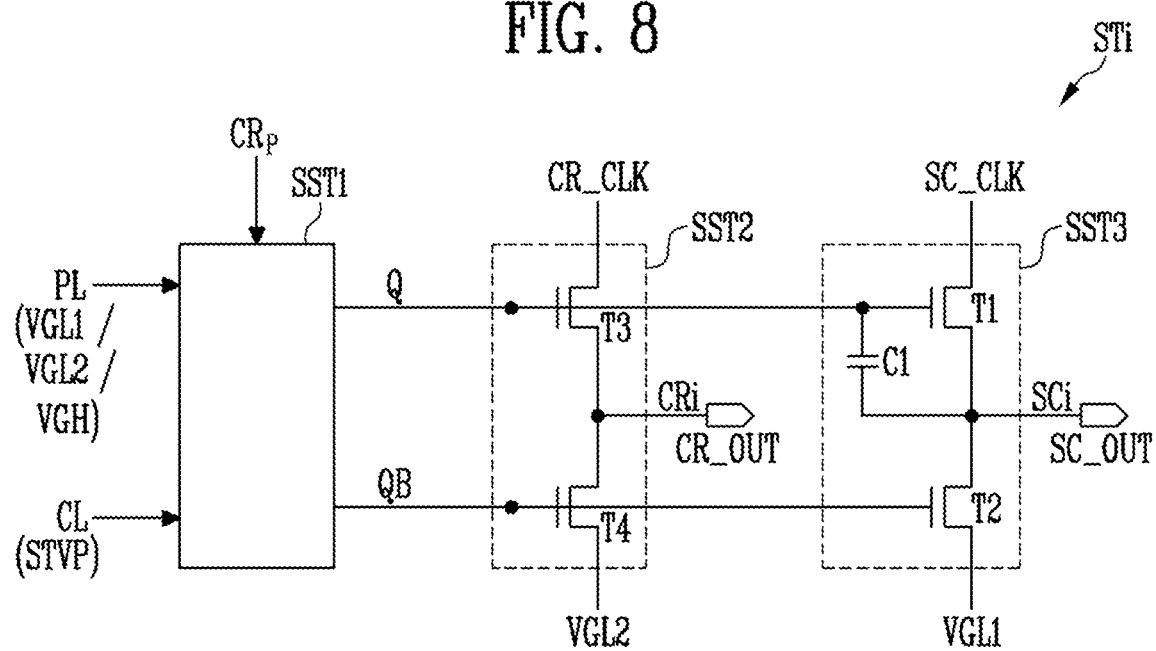
FIG. 8 is a diagram illustrating an example of a stage included in the gate driving circuit of FIG. 6.

FIG. 8 is a diagram illustrating an example of a stage included in the gate driving circuit of FIG. 6. Since the stages ST1 to STn shown in FIG. 6 are substantially the same as or similar to each other, the stages STi (here, i is a positive integer less than or equal to n) will be described as representative of the stages ST1 to STn.

Referring to FIGS. 6 to 8, the stage STi may include a node control circuit SST1, a first output circuit SST2, and a second output circuit SST3. The clock lines CLKS may include a carry clock line CR_CLK and a scan clock line SC_CLK. The clock lines CLKS may correspond to the first to eighth clock lines CLKS1 to CLKS8 described with reference to FIG. 6. A corresponding carry clock signal among the first to eighth carry clock signals CR_CK1 to CR_CK8 described with reference to FIG. 7 may be applied to the carry clock line CR_CLK, and a corresponding scan clock signal among the first to eighth scan clock signals SC_CK1 to SC_CK8 described with reference to FIG. 7 may be applied to the scan clock line SC_CLK.

The node control circuit SST1 may be connected to the previous carry line CRp (here, p is a positive integer) of the previous stage, power lines PL, and control lines CL. The power lines PL may include first and second low voltage lines VGL1 and VGL2 to which low voltages (or voltages having a turn-off voltage level) for turning off a transistor are applied, and a high voltage line VGH to which a high voltage (or a voltage having a turn-on voltage level) for turning on a transistor is applied. According to an embodiment, the power lines PL may include only one low voltage line. In another embodiment, the power lines PL may not include a high voltage line.

The node control circuit SST1 may control a node voltage (i.e., first node voltage) of a first node Q and a node voltage (i.e., second node voltage) of a second node QB based on a previous carry signal (or start signal provided through a start signal line STVP) provided through the previous carry line CRp of the previous stage.

For example, when the previous carry signal has a logic low level (or turn-off voltage level), the node control circuit SST1 may control the second node QB so that the second node voltage of the second node QB has a logic high level (or turn-on voltage level), and may control the first node Q so that the first node voltage of the first node Q is maintained at a logic low level. For example, when the previous carry signal has a logic high level, the node control circuit SST1 may control the first node Q so that the first node voltage of the first node Q has a logic high level and may control the second node QB so that the second node voltage of the second node QB is maintained at a logic low level.

According to an embodiment, the node control circuit SST1 may control the node voltage (i.e., the first node voltage) of the first node Q and the node voltage (i.e., the second node voltage) of second node QB based on the control signals provided through the control lines CL. For example, the node control circuit SST1 may control the first node Q so that the first node voltage of the first node Q is maintained at a logic low level or reset based on the start signal provided through the start signal line STVP.

The first output circuit SST2 may output a carry clock signal applied to the carry clock line CR_CLK in response to the first node voltage of the first node Q as a carry signal through a carry output terminal CR_OUT (or carry line CRi), and may full-down or maintain a carry signal at the second logic low level (or the second low voltage applied to the second low voltage line VGL2 (or the second power line)) in response to the second node voltage of the second node QB. The first output circuit SST2 may include a third transistor T3 and a fourth transistor T4, and the third transistor T3 may include a first electrode connected to the carry clock line CR_CLK, a second electrode connected to the carry output terminal CR_OUT, and a gate electrode connected to the first node Q. The fourth transistor T4 may include a first electrode connected to the carry output terminal CR_OUT, a second electrode connected to the second low voltage line VGL2, and a gate electrode connected to the second node QB.

The second output circuit SST3 may output a scan clock signal provided through the scan clock line SC_CLK in response to the first node voltage of the first node Q as a scan signal to a scan output terminal SCOUT (or scan line SCi), and may full-down or maintain a scan signal at the first logic low level (or the first low voltage applied to the first low voltage line VGL1 (or the first power line)) in response to the second node voltage of the second node QB. The second output circuit SST3 may include a first transistor T1 and a second transistor T2. The first transistor T1 may include a first electrode connected to the scan clock line SC_CLK, a second electrode connected to a scan output terminal SC_OUT, and a gate electrode connected to the first node Q. The second transistor T2 may include a first electrode connected to the scan output terminal SC_OUT, a second electrode connected to the first low voltage line VGL1, and a gate electrode connected to the second node QB. In addition, the second output circuit SST3 may further include a first capacitor C1 connected between the gate electrode of the first transistor T1 and the scan output terminal SC_OUT in order to boost the scan clock signal of a logic high level.

Since a waveform of the scan signal and a waveform of the carry signal may be different from each other, the scan clock line SC_CLK that is distinguished from the carry clock line CR_CLK may be used, and a second output circuit SST3 that is distinguished from the first output circuit SST2 may be provided in the stage STi. To prevent interference between an output of the first output circuit SST2 (i.e., carry signal) and an output of the second output circuit SST3 (i.e., scan signal), the first low voltage line VGL1 and the second low voltage line VGL2 may be used.

Meanwhile, in FIG. 8, the stage STi is illustrated as including a first output circuit SST2 for outputting a carry signal and a second output circuit SST3 for outputting a scan signal, but the stage STi is not limited thereto. For example, the stage STi may further include a third output circuit for independently outputting the sensing scan signal from the scan signal, and the third output circuit may be implemented substantially the same as the second output circuit SST3.

Figure 9:
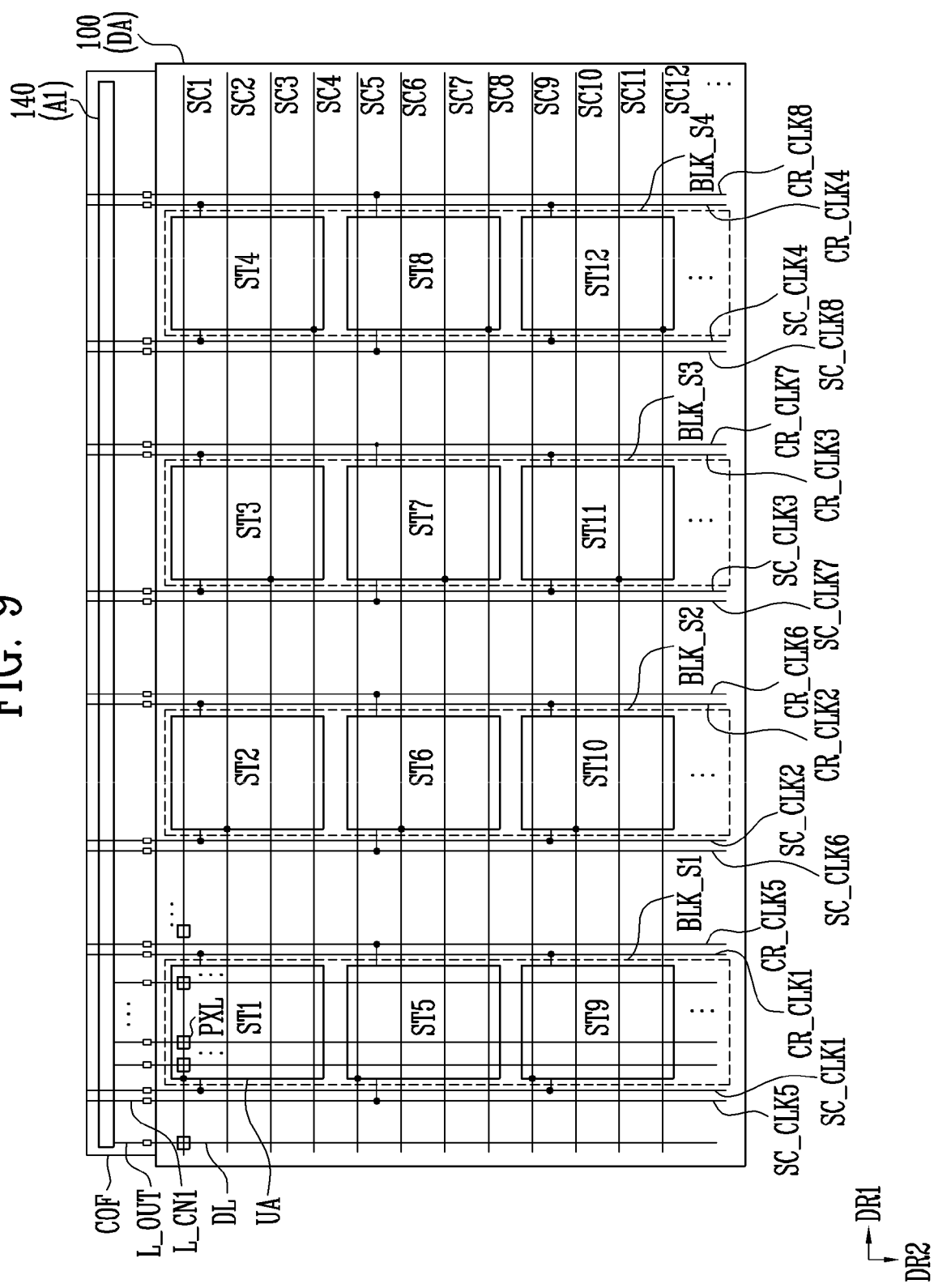
FIG. 9 is a drawing showing an embodiment of the display device of FIG. 5.
Figure 10:
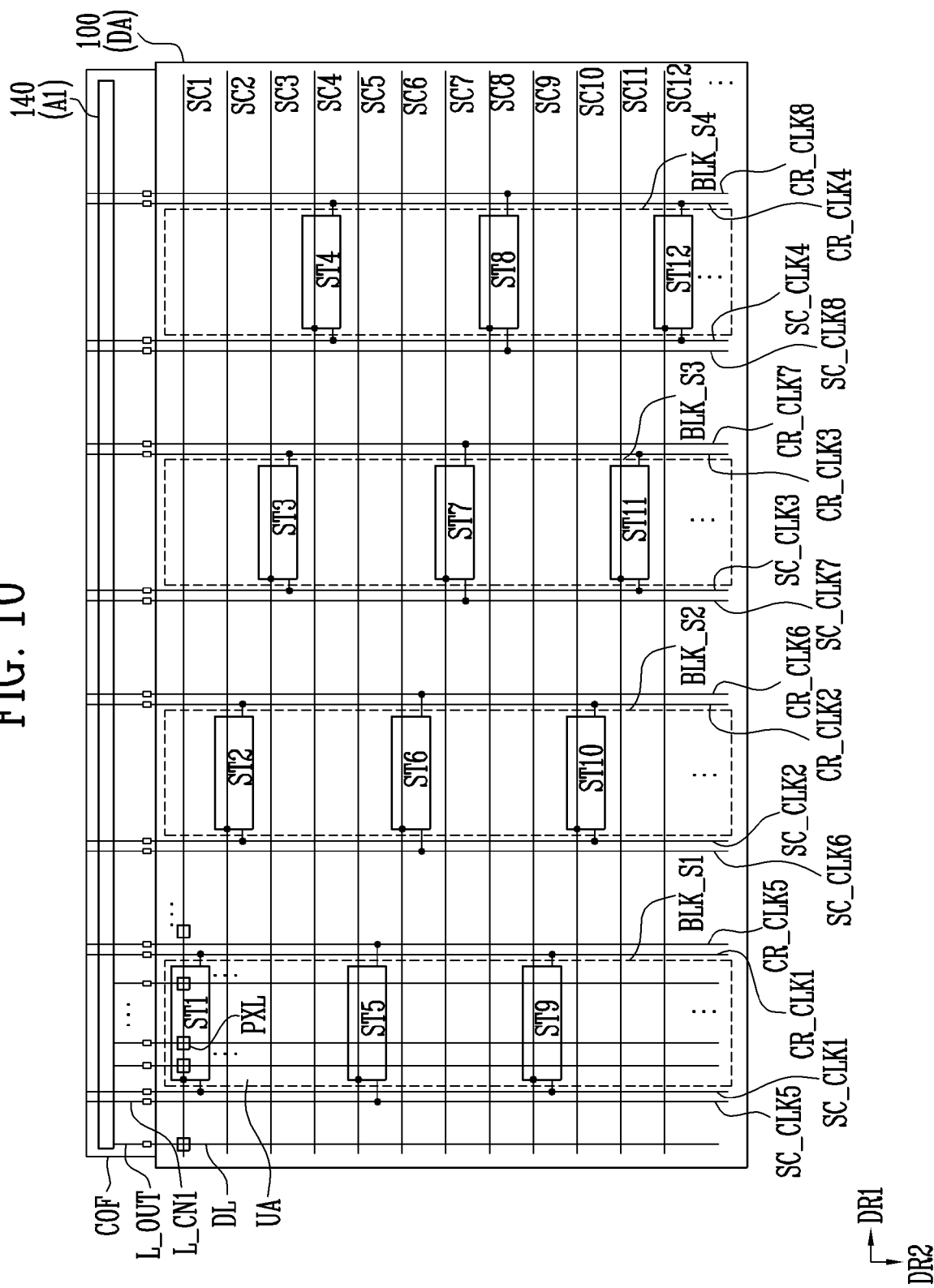
FIG. 10 is a drawing illustrating another example of the display device of FIG. 5.

FIG. 9 is a drawing showing an embodiment of the display device of FIG. 5. FIG. 10 is a drawing illustrating another example of the display device of FIG. 5. Since the first block BLK1, the data driver 140 connected to the first block BLK1, and the connection film COF shown in FIG. 5 are substantially the same as or similar to the second block BLK2, the data driver 140 connected to the second block BLK2, and the connection film COF except for the arrangement, the display device is schematically illustrated focusing on the first block BLK1, the data driver 140 connected to the first block BLK1, and the connection film COF in FIGS. 9 and 10. In addition, in FIGS. 9 and 10, the display device is schematically illustrated focusing on the clock lines SC_CLK1 to SC_CLK8 and CR_CLK1 to CR_CLK8 in the display panel 100.

Referring to FIGS. 5 to 9, the display panel 100 may include stages ST1 to ST12 (or gate driving circuit 120 (refer to FIG. 5)) dispersed in the display area DA. The stages ST1 to ST12 may correspond to the stages ST1 to STn described with reference to FIG. 6. As described with reference to FIG.

5, to minimize the non-display area of the display panel 100, the stages ST1 to ST12 may be dispersed in the display area DA.

Each of the stages ST1 to ST12 may be dispersed in a unit area UA which includes a plurality of pixel rows and a plurality of pixel columns. As shown in FIG. 9, the first stage ST1 may be disposed in the unit area UA where first to fourth scan lines SC1 to SC4 and a plurality of data lines DL (for example, 40 data lines DL) cross each other. That is, the stages ST1 to STn may be disposed in the unit area UA each corresponding to consecutive four scan lines. However, this is an example, and in consideration of the number and capacity of transistors and capacitors constituting the stages ST1 to STn, each of the stages ST1 to ST12 may be disposed in the unit area corresponding to 1, 2, 3, 5 or more scan lines. For example, as shown in FIG. 10, each of the stages ST1 to ST12 may be disposed to correspond to one pixel row, respectively, and the stages ST1 to ST12 may not overlap one another in the first direction DR1.

The stages ST1 to STn may include a plurality of sub-blocks BLK_S1 to BLK_S4 extending along a second direction DR2 and may be disposed in areas separated from each other. As shown in FIG. 9, the stages ST1 to STn may be divided into first to fourth sub-blocks BLK_S1 to BLK_S4. However, this is an example, and the stages ST1 to STn may be divided into eight sub-blocks or two sub-blocks. The number of sub-blocks may be variously set according to the number of clock lines SC_CLK1 to SC_CLK8 and CR_CLK1 to CR_CLK8.

The first sub-block BLK_S1 may include the first stage ST1, the fifth stage ST5, and the ninth stage ST9. That is, the first sub-block BLK_S1 may include stages connected to the first scan clock line SC_CLK1 and the fifth scan clock line SC_CLK5 (and the first carry clock line CR_CLK1 and the fifth carry clock line CR_CLK5).

In an embodiment, the stages ST1, ST5, and ST9 in the first sub-block BLK_S1 may be disposed to be spaced apart from each other along the second direction DR2. For example, as shown in FIG. 10, the first stage ST1 and the fifth stage ST5 may be disposed spaced apart from each other with a space in which at least one line can extend in the first direction DR1. As described later with reference to FIG. 13, a power line (or horizontal power line) extending in the first direction DR1 may be disposed in the space between adjacent stages along the second direction.

Similarly, the second sub-block BLK_S2 may include the second stage ST2, the sixth stage ST6, the tenth stage ST10, and the like connected to the second scan clock line SC_CLK2 and the sixth scan clock line SC_CLK6 (and the second carry clock line CR_CLK2 and the sixth carry clock line CR_CLK6). The third sub-block BLK_S3 may include the third stage ST3, the seventh stage ST7, and the eleventh stage ST11, and the like connected to the third scan clock line SC_CLK3 and the seventh scan clock line SC_CLK7 (and the third carry clock line CR_CLK3 and the seventh carry clock line CR_CLK7). The fourth sub-block BLK_S4 may include the fourth stage ST4, the eighth stage ST8, the twelfth stage ST12, and the like connected to the fourth scan clock line SC_CLK4 and the eighth scan clock line SC_CLK8 (and the fourth carry clock line CR_CLK4 and the eighth carry clock line CR_CLK8).

When the stages ST1 to STn are divided into first to fourth sub-blocks BLK_S1 to BLK_S4, the clock lines SC_CLK1 to SC_CLK8 and CR_CLK1 to CR_CLK8 may be dispersed to be adjacent to the corresponding sub-block, and interference (for example, capacitance due to overlapping) between the clock lines SC_CLK1 to SC_CLK8 and CR_CLK1 to CR_CLK8 may be reduced.

In addition, since each of the first to fourth sub-blocks BLK_S1 to BLK_S4 includes only stages which receive a carry signal from a stage included in the sub-block in which the stage is included, the carry signal line transferring the carry signal between the first to fourth sub-blocks BLK_S1 to BLK_S4 is eliminated, thus parasitic capacitance for the carry signal line may also be reduced.

The display panel 100 may include clock lines SC_CLK1 to SC_CLK8 and CR_CLK1 to CR_CLK8 disposed between the data lines DL. The clock lines may include first to eighth scan clock lines SC_CLK1 to SC_CLK8 and first to eighth carry clock lines CR_CLK1 to CR_CLK8. The first to the eighth scan clock lines SC_CLK1 to SC_CLK8 and the first to eighth carry clock lines CR_CLK1 to CR_CLK8 may correspond to the scan clock line SC_CLK and the carry clock line CR_CLK described with reference to FIG. 8, respectively. The first to eighth scan clock signals SC_CK1 to SC_CK8 described with reference to FIG. 7 may be applied to the first to eighth scan clock lines SC_CLK1 to SC_CLK8, respectively, and the first to eighth carry clock signals CR_CK1 to CR_CK8 may be applied to the first to eighth carry clock lines CR_CLK1 to CR_CLK8, respectively. In addition, the first scan clock line SC_CLK1 and the first carry clock line CR_CLK1 may be included in the first clock lines CLKS1 described with reference to FIG. 6, and the second scan clock line SC_CLK2 and the second carry clock line CR_CLK2 may be included in the second clock lines CLKS2 described with reference to FIG. 6. That is, the j-th (here, j is a positive integer less than or equal to 8) scan clock line and the j-th carry clock line may be included in j-th clock lines described with reference to FIG. 6.

The clock lines SC_CLK1 to SC_CLK8 and CR_CLK1 to CR_CLK8 may be connected to the first connection lines L_CN1 in the connection film COF, and may receive the clock signals from the timing controller 150 through the printed circuit board PCB described with reference to FIG. 5. The first connection lines L_CN1 may be included in the connection lines L_CN described with reference to FIG. 5.

In embodiments, two clock lines having a phase difference of 180 degrees (or a half period) among the clock lines SC_CLK1 to SC_CLK8 and CR_CLK1 to CR_CLK8 are disposed to form a pair. As described above, since noise due to the two clock signals having a phase difference of 180 degrees cancels each other, the influence of the clock lines on pixels PXL adjacent thereto may be reduced.

In an embodiment, the scan clock lines SC_CLK1 to SC_CLK8 may be disposed adjacent to one side of the corresponding sub-block, and the carry clock lines CR_CLK1 to CR_CLK8 may be disposed adjacent to the other side of the corresponding sub-block.

For example, the first scan clock line SC_CLK1 and the fifth scan clock line SC_CLK5 having a phase difference of 180 degrees with respect to the first scan clock line SC_CLK1 may form a pair and may be disposed on one side of the first sub-block BLK_S1. The first carry clock line CR_CLK1 and the fifth carry clock line CR_CLK5 having a phase difference of 180 degrees with respect to the first carry clock line CR_CLK1 may form a pair, and may be disposed on the other side of the first sub-block BLK_S1 (for example, between the first sub-block BLK_S1 and the second sub-block BLK_S2).

Similarly, the second scan clock line SC_CLK2 and the sixth scan clock line SC_CLK6 having a phase difference of 180 degrees with respect to the second scan clock line SC_CLK2 may form a pair and may be disposed on one side of the second sub-block BLK_S2 (for example, between the first sub-block BLK_S1 and the second sub-block BLK_S2). The second carry clock line CR_CLK2 and the sixth carry clock line CR_CLK6 having a phase difference of 180 degrees with respect to the second carry clock line CR_CLK2 may form a pair and may be disposed on the other side of the second sub-block BLK_S2 (for example, the second sub-block BLK_S2 and the third sub-block BLK_S3).

In an embodiment, the second scan clock line SC_CLK2 and the sixth scan clock line SC_CLK6 may be disposed to be spaced apart from the first carry clock line CR_CLK1 and the fifth carry clock line CR_CLK5 with at least one pixel PXL interposed therebetween. For example, the second scan clock line SC_CLK2 and the sixth scan clock line SC_CLK6 may be disposed to be spaced apart from the first carry clock line CR_CLK1 and the fifth carry clock line CR_CLK5 with 40 pixels PXL (or 40 data lines DL) interposed therebetween. According to an embodiment, a distance between the second and sixth scan clock lines SC_CLK2 and SC_CLK6 and the first and fifth carry clock lines CR_CLK1 and CR_CLK5, respectively may be the same as or different from a distance between the second and sixth carry clock lines CR_CLK2 and CR_CLK6 and the second and sixth scan clock lines SC_CLK2 and SC_CLK6.

Similarly, the third scan clock line SC_CLK3 and the seventh scan clock line SC_CLK7 having a phase difference of 180 degrees with respect to the third scan clock line SC_CLK3 may form a pair and may be disposed on one side of the third sub-block BLK_S3, and the third carry clock line CR_CLK3 and the seventh carry clock lines CR_CLK7 having a phase difference of 180 degrees with respect to the third carry clock line CR_CLK3 may form a pair and may be disposed on the other side of the third sub-block BLK_S3. The fourth scan clock line SC_CLK4 and the eighth scan clock line SC_CLK8 having a phase difference of 180 degrees with respect to the fourth scan clock line SC_CLK4 may form a pair and may be disposed on one side of the fourth sub-block BLK_S4, and the fourth carry clock line CR_CLK4 and the eighth carry clock line CR_CLK8 having a phase difference of 180 degrees with respect to the fourth carry clock line CR_CLK4 may form a pair and may be disposed on the other side of the fourth sub-block BLK_S4.

Meanwhile, in FIGS. 9 and 10, only two clock lines are shown to be disposed on one side (or the other side) of one stage, but the present inventive concept is not limited thereto. For example, four clock lines may be disposed on one side of one stage in which the gate driving circuit 120 (refer to FIG. 5) (or the first block BLK1, see FIG. 5) includes two sub-blocks.

As described above, clock lines to which clock signals having complementary waveforms are applied may be arranged to form a pair. Accordingly, the influence of the clock lines on the pixels PXL may be reduced.

Figure 11:
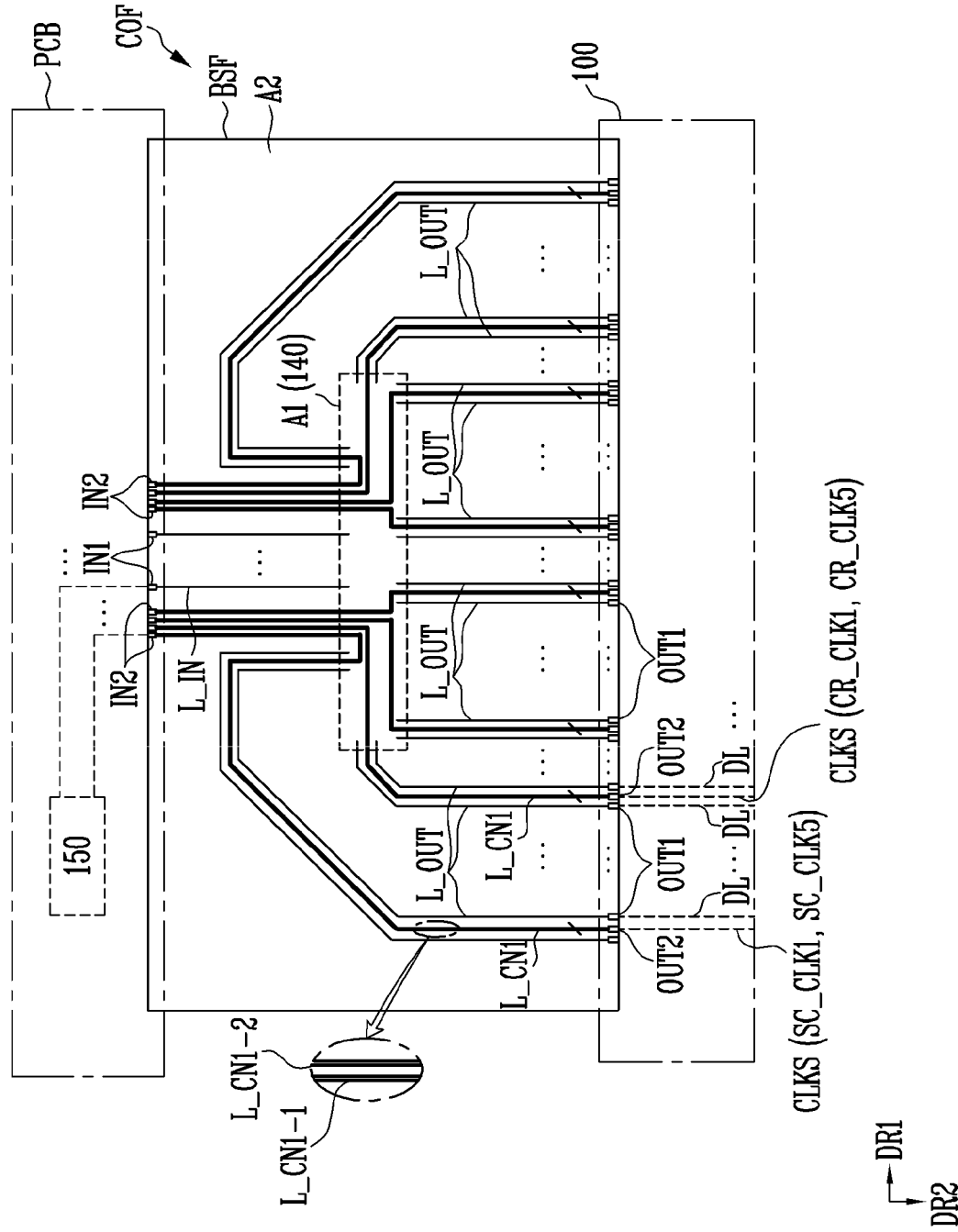
FIG. 11 is a diagram illustrating an example of a connection film included in the display device of FIG. 9.
Figure 12:
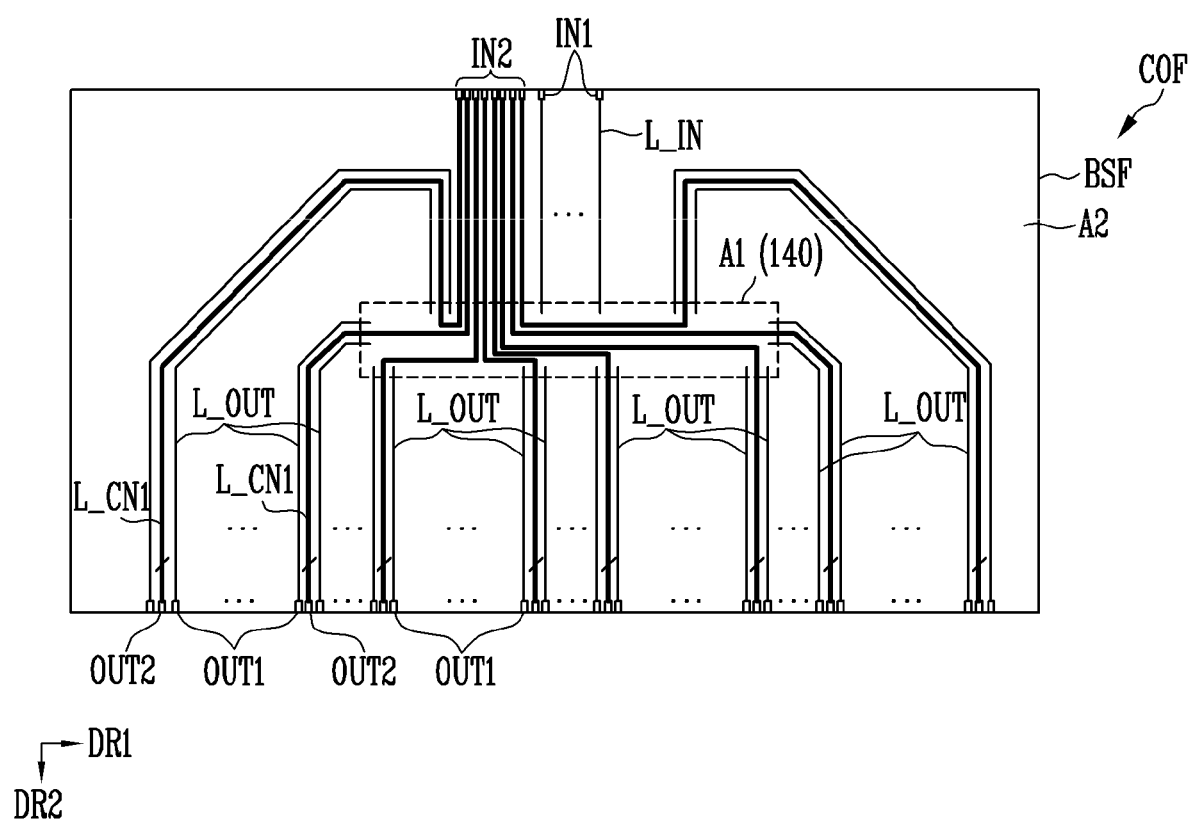
FIG. 12 is a diagram illustrating another example of a connection film included in the display device of FIG. 9.

FIG. 11 is a diagram illustrating an example of a connection film included in the display device of FIG. 9. In FIG. 11, a portion of the printed circuit board PCB connected to the connection film COF and a portion of the display panel 100 are further illustrated. FIG. 12 is a diagram illustrating another example of a connection film included in the display device of FIG. 9.

Referring to FIGS. 9 to 12, the connection film COF may include a base film BSF, first input terminals IN1, second input terminals IN2, first output terminals OUT1, and second output terminals OUT2, input lines L_IN, output lines L_OUT, and first connection lines L_CN1.

The base film BSF may be a flexible substrate. The base film BSF may include a first area A1 and a second area A2. The data driver 140 may be mounted in the first area A1. The second area A2 may surround the first area A1, and the first input terminals IN1, the second input terminals IN2, the first output terminals OUT1, the second output terminals OUT2, and the input lines L_IN, the output lines L_OUT, and the first connection lines L_CN1 may be disposed.

The first input terminals IN1 and the second input terminals IN2 may be disposed on one side (for example, upper side) of the base film BSF connected to the printed circuit board PCB. The first input terminals IN1 and the second input terminals IN2 may be connected to the timing controller 150 through conductive lines of the printed circuit board PCB.

As shown in FIG. 11, the first input terminals IN1 may be disposed between the second input terminals IN2, but the present inventive concept is not limited thereto. As shown in FIG. 12, the first input terminals IN1 and the second input terminals IN2 may be disposed in areas separated from each other, respectively.

The first output terminals OUT1 and the second output terminals OUT2 may be disposed on the other side (for example, lower side) of the base film BSF connected to the display panel 100. The first output terminals OUT1 may be connected to the data lines DL in the display panel 100. The second output terminals OUT2 may be connected to the clock lines CLKS in the display panel 100. The second output terminals OUT2 may be disposed between the first output terminals OUT1. That is, the first output terminals OUT1 and the second output terminals OUT2 may be alternately disposed in the first direction DR1.

The input lines L_IN may extend from the first input terminals IN1 to the first area A1. The input lines L_IN may connect the first input terminals IN1 to the data driver 140. The input lines L_IN may transfer a data control signal and image data from the timing controller 150 to the data driver 140. According to an embodiment, the first input terminals IN1 may be integrally formed with the input lines L_IN. In this case, the first input terminals IN1 may be one end of the input lines L_IN.

The output lines L_OUT may extend from the first area A1 to the first output terminals OUT1. The output lines L_OUT may connect the data driver 140 to the first output terminals OUT1. The output lines L_OUT may transfer data signals generated by the data driver 140 to the data lines DL in the display panel 100. According to an embodiment, the first output terminals OUT1 may be integrally formed with the output lines L_OUT.

The first connection lines L_CN1 may extend from the second input terminals IN2 to the second output terminals OUT2 via or through the first area A1. The first connection lines L_CN1 may connect the second input terminals IN2 to the second output terminals OUT2. According to an embodiment, the first connection lines L_CN1 may be integrally formed with the second input terminals IN2 and the second output terminals OUT2.

The first connection lines L_CN1 may be disposed between the output lines L_OUT. Further, the first connection lines L_CN1 may not cross the output lines L_OUT and the input lines L_IN, and the first connection lines L_CN1, the output lines L_OUT, and the input lines L_IN may be disposed on the same layer on the base film BSF and be formed at the same time through the same process.

According to a configuration between the clock lines SC_CLK1 to SC_CLK8 and CR_CLK1 to CR_CLK8 and the data lines DL described with reference to FIG. 9, the first connection lines L_CN1 may be disposed between the output lines L_OUT. In addition, according to the arrangement of the output lines L_OUT, some of the first connection lines L_CN1 may sequentially extend in a direction opposite to the second direction DR2 from the first area A1, extend in a direction opposite to the first direction DR1, extend in a diagonal direction, and then extend in a second direction DR2 toward the display device 100.

In embodiments, the first connection lines L_CN1 disposed between two adjacent data lines DL may include at least two sub-connection lines. Correspondingly, the second output terminals OUT2 may also include at least two sub-output terminals. For example, as shown in FIG. 11, the first connection lines L_CN1 may include a first sub-connection line L_CN1-1 and a second sub-connection line L_CN1-2. The first sub-connection line L_CN1-1 and the second sub-connection line L_CN1-2 may be connected to a pair of clock lines (for example, the first and fifth scan clock lines SC_CLK1 and SC_CLK5, or the first and fifth carry clock lines CR_CLK1 and CR_CLK5, and the like) through the second output terminals OUT2 (or sub-output terminals). That is, each of the first connection lines L_CN1 may include a plurality of groups including two sub-connection lines. The groups may be disposed to be spaced apart from each other with the output lines L_OUT interposed therebetween.

Meanwhile, in FIG. 11, distances between first connection lines L_CN1 (i.e., distances between a pair of first connection lines L_CN1 and another pair of first connection lines L_CN1 adjacent thereto, or distances between groups) are shown to be different from each other, but this is an example and is not limited thereto. For example, the distances between the first connection lines L_CN1 may be the same, and about 40 output lines L_OUT may be equally disposed between the first connection lines L_CN1 (i.e., between groups).

As described with reference to FIGS. 11 and 12, the connection film COF may include the first connection lines L_CN1 disposed to overlap the first area A1 on which the data driver 140 is mounted in a plan view, and the first connection lines L_CN1 may be disposed between the output lines L_OUT and may not cross the output lines L_OUT and the input lines L_IN. For example, some of the first connection lines L_CN1 may completely cross the first area A1 from an upper side to a lower side of the first area A1 and some of the first connection lines L_CN1 may overlap an area disposed close to the upper side of the first area A1. Accordingly, the connection film COF may include only one conductive layer, and manufacturing cost of the connection film COF may not increase.

Figure 13:
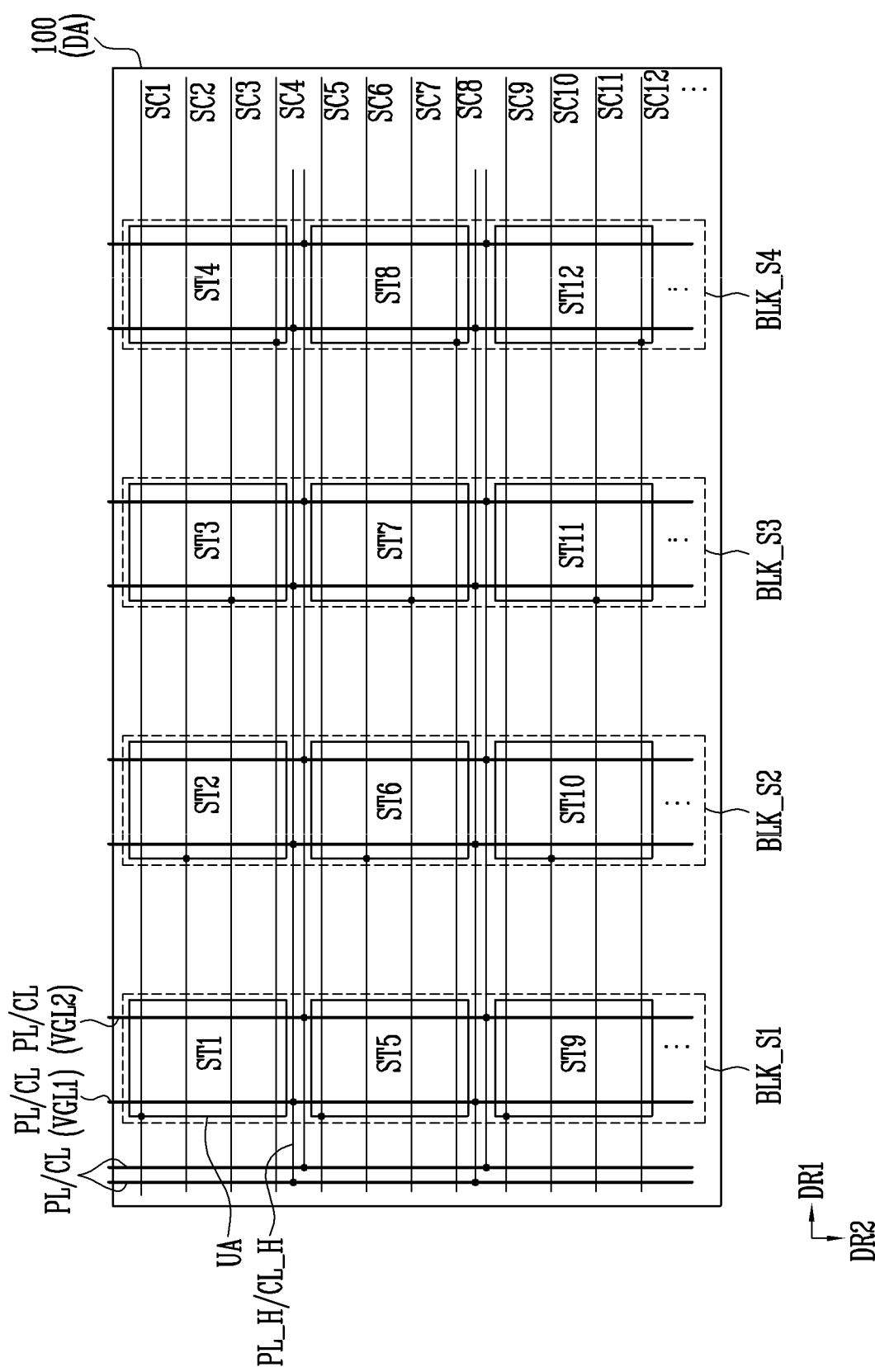
FIG. 13 is a drawing illustrating another example of the display device of FIG. 5.

FIG. 13 is a drawing illustrating another example of the display device of FIG. 5. In FIG. 13, a drawing corresponding to FIG. 9 is shown. Also, in FIG. 13, the display panel 100 is schematically illustrated focusing on the power lines PL and the control lines CL in the display panel 100. That is, for convenience of description, the clock lines SC_CLK1 to SC_CLK8 and CR_CLK1 to CR_CLK8 shown in FIG. 9 are omitted. The clock lines SC_CLK1 to SC_CLK8 and CR_CLK1 to CR_CLK8 described with reference to FIG. 9 may be disposed in the display panel 100 shown in FIG. 13. Further, the stages ST1 to ST12 described with reference to FIG. 10 may also be applied to the example.

Referring to FIGS. 5 and 13, the power lines PL (and/or control lines CL) may extend in the second direction DR2 and may be dispersed in the display area DA of the display panel 100 in the first direction DR1.

As shown in FIG. 13, some of the power lines PL may be disposed adjacent to one side of the display panel 100, and some of the power lines PL may be disposed across the sub-blocks BLK_S1 to BLK_S4 (or stages ST1 to ST12).

In an embodiment, the power lines PL may include a first low voltage line VGL1, a second low voltage line VGL2, and a high voltage line VGH described with reference to FIG. 8.

In an embodiment, the first low voltage line VGL1 (or some power lines PL including the same) may be disposed adjacent to one side of each of the sub-blocks BLK_S1 to BLK_S4 (or stages ST1 to ST12), and the second low voltage line VGL2 (or other power lines PL including the same) may be disposed adjacent to the other side of each of the sub-blocks BLK_S1 to BLK_S4 (or stages ST1 to ST12). As described with reference to FIG. 9, when the scan clock lines SC_CLK1 to SC_CLK8 are disposed adjacent to one side of the corresponding sub-block, the second output circuit SST3 described with reference to FIG. 8 may be disposed adjacent to one side of the sub-block. Similarly, when the carry clock lines CR_CLK1 to CR_CLK8 are disposed adjacent to the other side of the corresponding sub-block, the first output circuit SST2 described with reference to FIG. 8 may be disposed adjacent to the other side of the sub-block. Further, in this case, the node control circuit SST1 described with reference to FIG. 8 may be disposed between the first output circuit SST2 and the second output circuit SST3 in one stage.

Therefore, to reduce lines extending in the second direction DR2 in one stage, the first low voltage line VGL1 connected to the second output circuit SST3 may be disposed adjacent to one side of each of the sub-blocks BLK_S1 to BLK_S4 (or stages ST1 to ST12), and the second low voltage line VGL2 connected to the first output circuit SST2 may be disposed adjacent to the other side of each of the sub-blocks BLK_S1 to BLK_S4 (or stages ST1 to ST12).

In embodiments, the power lines PL (or control lines CL) may be connected to each other through horizontal power lines PL_H (or horizontal control lines CL_H) extending in the first direction DR1. For example, the power lines PL (or control lines CL) may be disposed on the same layer as the source and drain electrodes SE and DE described with reference to FIG. 4, and the horizontal power lines PL_H (or horizontal control lines CL_H) may be disposed on the same layer as the gate electrode GE described with reference to FIG. 4.

The power lines PL (or control lines CL) and the horizontal power lines PL_H (or horizontal control lines CL_H) may form a mesh structure in which one stage is a basic unit.

The power lines PL (or control lines CL) may be dispersed in the display area DA of the display panel 100 and be electrically connected to each other, so only some power lines PL (or control lines CL) among the power lines PL (or control lines CL) may be connected to the power supply 160 (or timing controller 150) through the connection film COF (refer FIG. 5). For example, the power lines PL (or control lines CL) may be connected to some of the first connection lines L_CN1 described with reference to FIG. 11.

Figure 14:
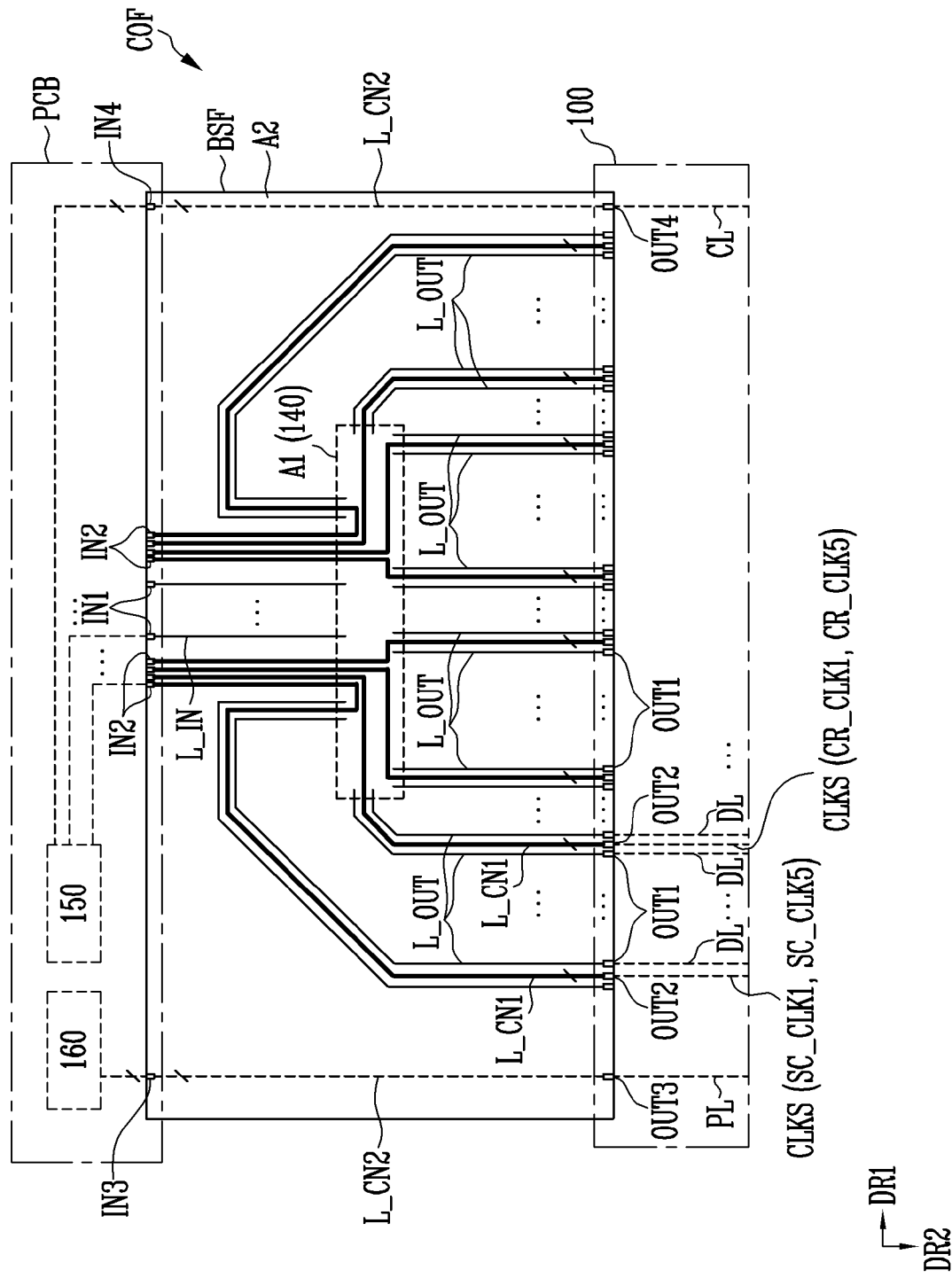
FIG. 14 is a drawing illustrating an example of a connection film included in the display device of FIG. 13.
Figure 15:
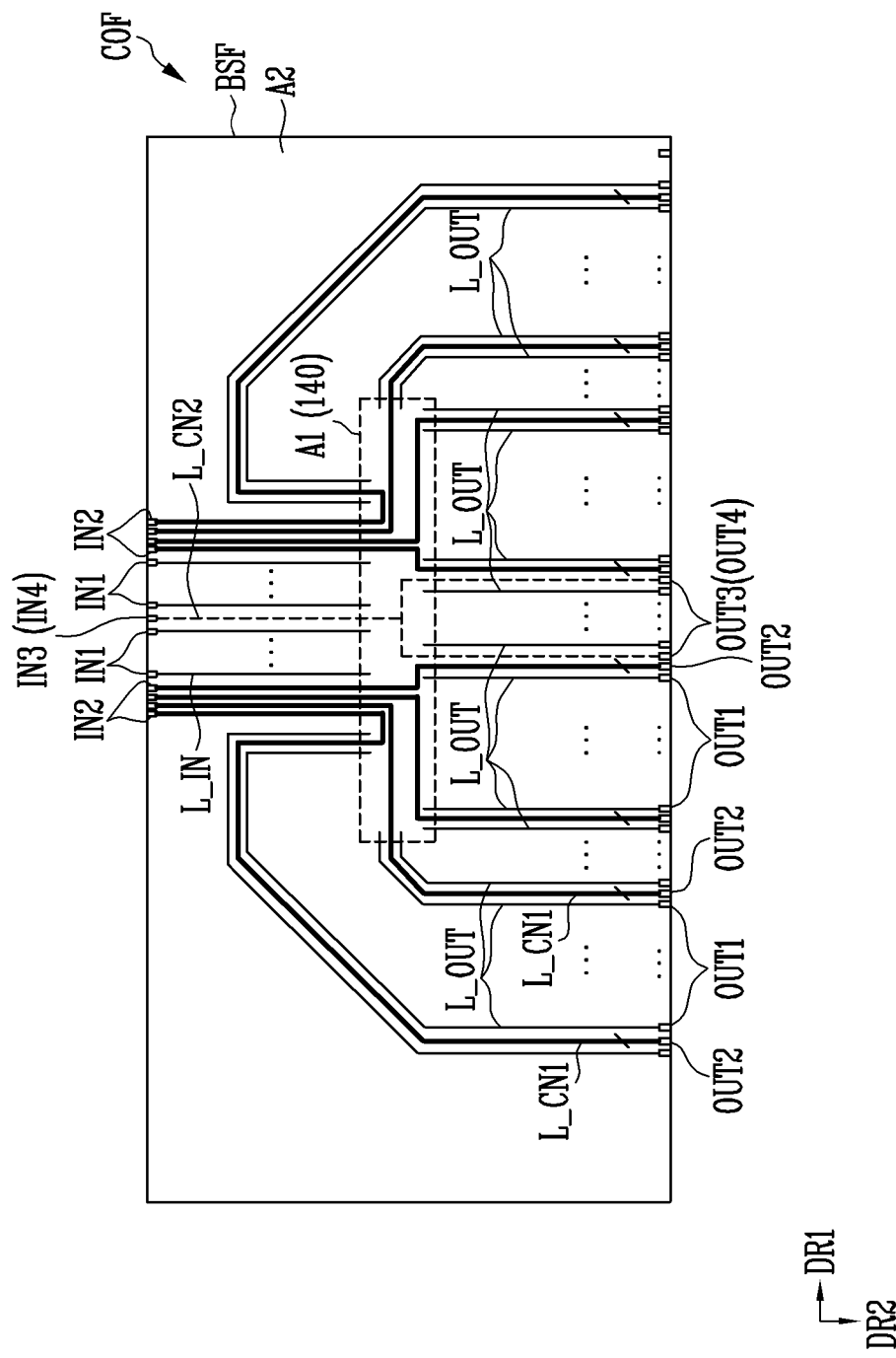
FIG. 15 is a drawing illustrating another example of a connecting film included in the display device of FIG. 13.

However, the connection between the power lines PL (or control lines CL) and the connection film COF is not limited thereto. FIGS. 14 and 15 may be referred to describe another connection configuration between the power lines PL (or control lines CL) and the connection film COF.

FIG. 14 is a drawing illustrating an example of a connection film included in the display device of FIG. 13. A drawing corresponding to FIG. 11 is illustrated in FIG. 14. FIG. 15 is a drawing illustrating another example of a connecting film included in the display device of FIG. 13.

Referring to FIGS. 11 to 15, the connection film COF may further include the third input terminals IN3 (or at least one third input terminal), the third output terminals OUT3 (or at least one third output terminal), and the second connection lines L_CN2 (or at least one second connection line).

The third input terminals IN3 may be disposed on one side (for example, upper side) of the base film BSF connected to the printed circuit board PCB. The third input terminals IN3 may be connected to the power supply 160 through lines in the printed circuit board PCB.

The third output terminals OUT3 may be disposed on the other side (for example, lower side) of the base film BSF connected to the display panel 100. The third output terminals OUT3 may be connected to the power lines PL in the display panel 100.

The second connection lines L_CN2 may connect the third input terminals IN3 and the third output terminals OUT3. According to an embodiment, the second connection lines L_CN2 may be integrally formed with the third input terminals IN3 and the third output terminals OUT3.

For example, as shown in FIG. 14, the third input terminals IN3 may be disposed on one side of the first and second input terminals IN1 and IN2 or may be disposed adjacent to one side edge (for example, left side edge) of the base film BSF. Similarly, the third output terminals OUT3 may be disposed on one side of the first and second output terminals OUT1 and OUT2 or may be disposed adjacent to one side edge (for example, left side edge) of the base film BSF. In this case, the second connection lines L_CN2 may extend from the third input terminals IN3 to the third output terminals OUT3 in the second area A2 of the base film BSF not to overlap the first area A1, for example, may be disposed more adjacent to one side edge (for example, left side edge) of the base film BSF than the output lines L_OUT. The second connection lines L_CN2 may be connected to the power lines PL adjacent to one side edge (for example, left side edge) of the display panel 100 in FIG. 13. Since only the first connection lines L_CN1 are disposed across the first area A1, the number of the first connection lines L_CN1 may be relatively increased, or the distance between the first connection lines L_CN1 in the first area A1 may be increased, so interference between the first connection lines L_CN1 may be reduced.

For another example, as shown in FIG. 15, the third input terminals IN3 may be disposed between the first input terminals IN1, and the third output terminals OUT3 may be disposed between the first and second output terminals OUT1 and OUT2. In this case, the second connection lines L_CN2 may extend from the third input terminals IN3 to the third output terminals OUT3 via or through the first area A1 to overlap the first area A1. According to an embodiment, one of the second connection lines L_CN2 may be branched into a plurality of second connection lines L_CN2 and connected to the plurality of third output terminals OUT3. The second connection lines L_CN2 may be connected to the power lines PL overlapping at least one of the sub-blocks BLK_S1 to BLK_S4 in FIG. 13. When the second connection lines L_CN2 are disposed between the first connection lines L_CN1 in the first area A1, interference between the first connection lines L_CN1 may be reduced by the second connection lines L_CN2 to which voltages in the DC form (or control signal having a generally DC form) are applied.

In an embodiment, the connection film COF further includes fourth input terminals IN4 (or at least one fourth input terminal), and fourth output terminals OUT4 (or at least one fourth output terminal).

The fourth input terminals IN4 may be disposed on one side (for example, upper side) of the base film BSF connected to the printed circuit board PCB. The fourth input terminals IN4 may be connected to the timing controller 150 through lines of the printed circuit board PCB.

The fourth output terminals OUT4 may be disposed on the other side (for example, lower side) of the base film BSF connected to the display panel 100. The fourth output terminals OUT4 may be connected to the control lines CL in the display panel 100.

The fourth input terminals IN4 and the fourth output terminals OUT4 may be connected through second connection lines L_CN2 (or third connection lines).

For example, as shown in FIG. 14, the fourth input terminals IN4 and the fourth output terminals OUT4 may be disposed adjacent to the other side edge (for example, right side edge) of the base film BSF. In this case, the fourth input terminals IN4 and the fourth output terminals OUT4 may be connected to each other through the second area A2 of the base film BSF not to overlap the first area A1, for example the second connection lines L_CN2 disposed more adjacent to the other side edge (for example, right side edge) of the base film BSF than the output lines L_OUT.

For another example, the fourth input terminals IN4 and the fourth output terminals OUT4 may be disposed similarly to the third input terminals IN3 and the third output terminals OUT3 described with reference to FIG. 15.

As described with reference to FIGS. 13 to 15, the power lines PL and the control lines CL commonly connected to the stages ST1 to ST12 may be disposed in a mesh structure in the display panel 100. The connection film COF may further include the second connection lines L_CN2 connected to the power lines PL and the control lines CL, and the second connection lines L_CN2 may be disposed more adjacent to one side edge of the connection film than the output lines L_OUT or may be disposed across the first area A1 similar to the first connection lines L_CN1.

Figure 16:
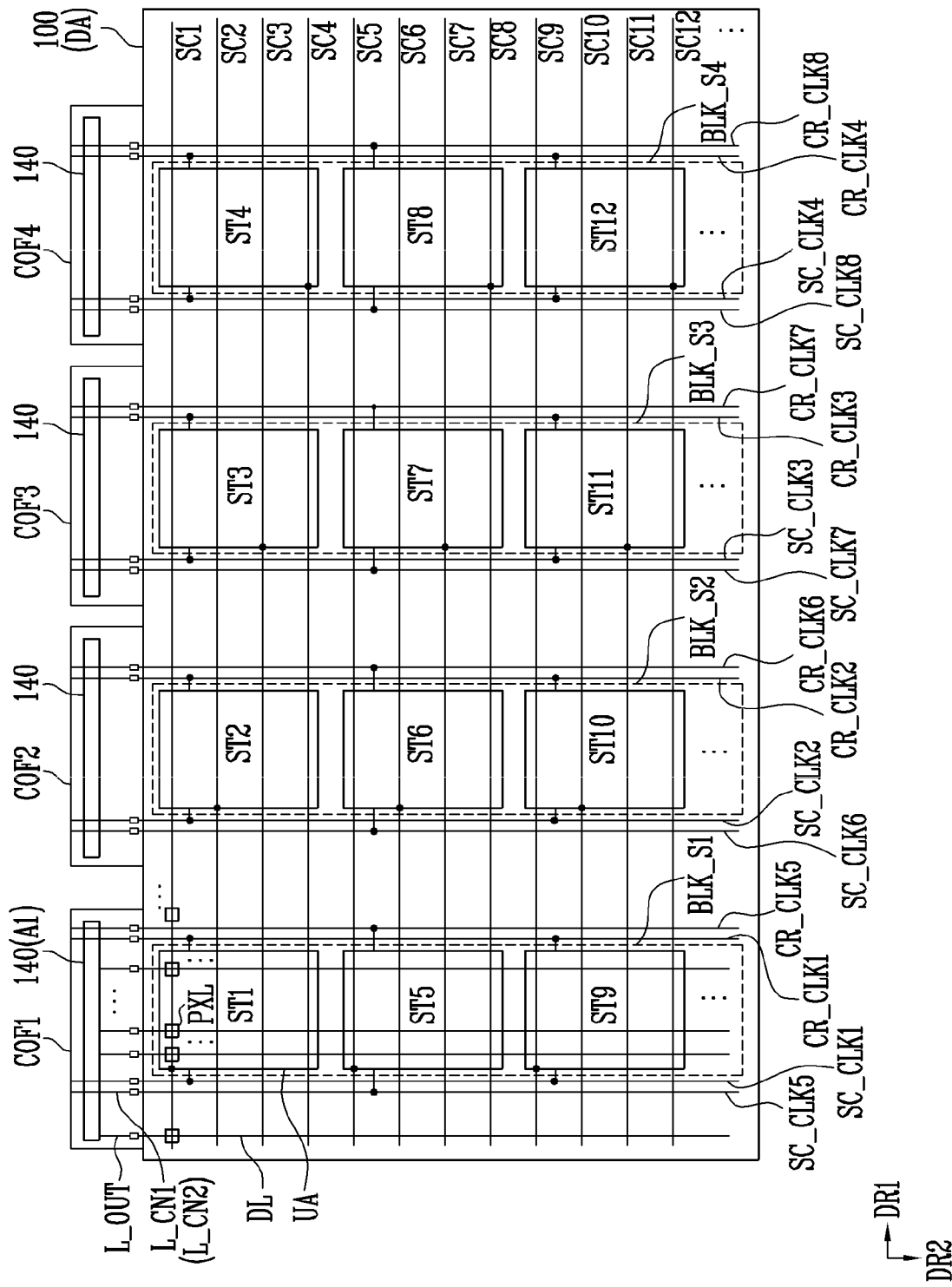
FIG. 16 is a drawing illustrating another example of the display device of FIG. 5.

FIG. 16 is a drawing illustrating another example of the display device of FIG. 5. In FIG. 16, a drawing corresponding to FIG. 9 is illustrated.

Referring to FIGS. 5, 9, and 16, the clock lines SC_CLK1 to SC_CLK8, CR_CLK1 to CR_CLK8 may be connected to the timing controller 150 through a plurality of connection films COF1 to COF4 instead of one connection film COF. Meanwhile, in FIG. 16, the clock lines SC_CLK1 to SC_CLK8 and CR_CLK1 to CR_CLK8 are shown to be connected to the timing controller 150 through four connection films COF1 to COF4, but this is an example and is not limited thereto. For example, the clock lines SC_CLK1 to SC_CLK8 and CR_CLK1 to CR_CLK8 may be connected to the timing controller 150 through eight connection films. The number of connection films connected to the clock lines SC_CLK1 to SC_CLK8 and CR_CLK1 to CR_CLK8 may be variously set according to the number of clock lines SC_CLK1 to SC_CLK8 and CR_CLK1 to CR_CLK8.

As shown in FIG. 16, each of the first to fourth connection films COF1 to COF4 may be connected to clock lines for a corresponding one sub-block among the sub-blocks BLK_S1 to BLK_S4.

The first connection lines L_CN1 of the first connection film COF1 may be connected to the first and fifth scan clock lines SC_CLK1 and SC_CLK5 and the first and fifth carry clock lines CR_CLK1 and CR_CLK5 for the first sub-block BLK_S1.

The first connection lines L_CN1 of the second connection film COF2 may be connected to the second and sixth scan clock lines SC_CLK2 and SC_CLK6 and the second and sixth carry clock lines CR_CLK2 and CR_CLK6 for the second sub-block BLK_S2.

Similarly, the first connection lines L_CN1 of the third connection film COF3 may be connected to the third and seventh scan clock lines SC_CLK3 and SC_CLK7 and the third and seventh carry clock lines CR_CLK3 and CR_CLK7 for the third sub-block BLK_S3, and the first connection lines L_CN1 of the fourth connection film COF4 may be connected to the fourth and eighth scan clock lines SC_CLK4 and SC_CLK8 and the fourth and eighth carry clock lines CR_CLK4 and CR_CLK8 for the fourth sub-block BLK_S4.

According to an embodiment, each of the first to fourth connection films COF1 to COF4 may further include second connection lines L_CN2 connected to power lines and control lines for a corresponding one sub-block among the sub-blocks BLK_S1 to BLK_S4.

Each of the first to fourth connection films COF1 to COF4 may have the structures described with reference to FIGS. 11, 12, 13, and 14 or a combination thereof, but is not limited thereto.

Figure 17:
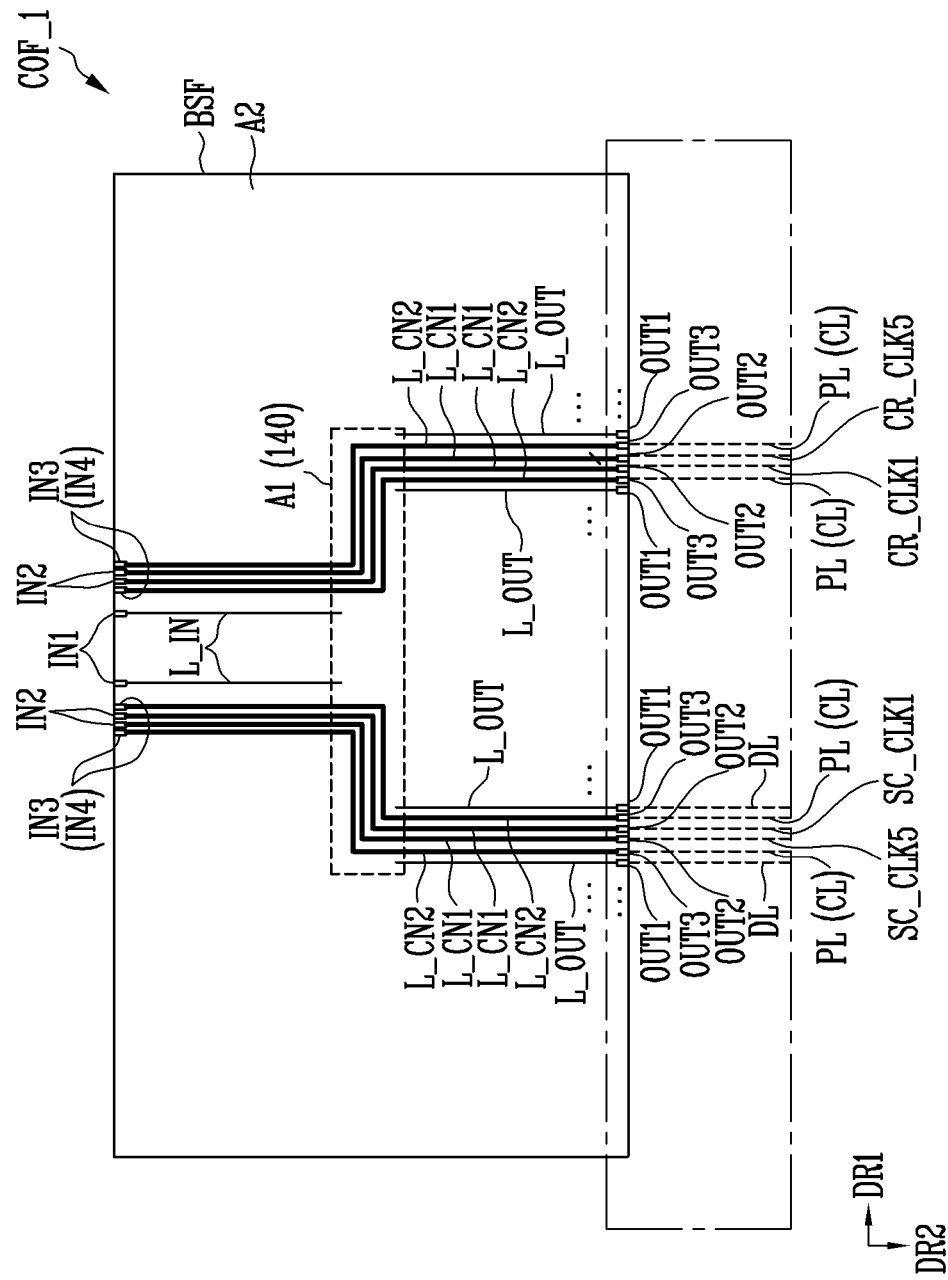
FIG. 17 is a drawing illustrating an example of a connection film included in the display device of FIG. 16.

FIG. 17 is a drawing illustrating an example of a connection film included in the display device of FIG. 16.

Referring to FIGS. 11, 12, and 14 to 17, the connection film COF_1 may include first to fourth input terminals IN1 to IN4, first to third output terminals OUT1 to OUT3, and input lines L_IN, output lines L_OUT, first connection lines L_CN1, and second connection lines L_CN2. Each of the first to fourth input terminals IN1 to IN4, the first to third output terminals OUT1 to OUT3, the input lines L_IN, the output lines L_OUT, the first connection lines L_CN1, and the second connection lines L_CN2 shown in FIG. 17 may be substantially the same as or similar to the first to fourth input terminals IN1 to IN4, first to third output terminals OUT1 to OUT3, the input lines L_IN, the output lines L_OUT, the first connection lines L_CN1, and the second connection lines L_CN2 described with reference to FIGS. 11 to 15, respectively. Therefore, duplicate descriptions will be omitted.

In embodiments, three or more connection lines may be arranged in a pair or as a group.

As shown in FIG. 17, four connection lines may be arranged in a pair. Two first connection lines L_CN1 and two second connection lines L_CN2 may be disposed between two adjacent output lines L_OUT.

As described with reference to FIG. 9, the first connection lines L_CN1 connected to two clock lines to which two clock signals having a phase difference of 180 degrees (or half a period) are applied among the clock lines SC_CLK1 to SC_CLK8 and CR_CLK1 to CR_CLK8, may be disposed adjacent to each other. As shown in FIG. 17, between two adjacent output lines L_OUT, the first connection lines L_CN1 connected to the first scan clock line SC_CLK1 and the fifth scan clock line SC_CLK5 having a phase difference of 180 degrees with respect to the first scan clock line SC_CLK1 may be disposed adjacent to each other. Similarly, between two adjacent output lines L_OUT, the first connection lines L_CN1 connected to the first carry clock line CR_CLK1 and the fifth carry clock line CR_CLK5 having a phase difference of 180 degrees with respect to the first carry clock line CR_CLK1 may be disposed adjacent to each other.

In embodiments, the first connection lines L_CN1 may be disposed between second connection lines L_CN2 adjacent to each other. Between the two adjacent output lines L_OUT, the second connection lines L_CN2 may be disposed more adjacent to the output lines L_OUT than the first connection lines L_CN1.

In this case, the second connection lines L_CN2 to which voltages having a DC form are generally applied may shield the first connection lines L_CN1 to which clock signals having an AC form are applied and may suppress or prevent coupling between the first connection lines L_CN1 and the output lines L_OUT. For example, the second connection lines L_CN2 connected to the first and second low voltage lines VGL1 and VGL2, the high voltage line VGL, and the start signal line STVP (i.e., start signal line to which start signal having a DC form compared to the clock signals is applied) described with reference to FIG. 8, may suppress or prevent coupling between the first connection lines L_CN1 and the output lines L_OUT.

In addition, clock lines may be disposed between the power lines PL (and the control lines CL) in the display panel 100 corresponding to the arrangement of the first and second connection lines L_CN1 and L_CN2. That is, the power lines PL (and the control lines CL) may be disposed adjacent to the data lines DL compared to the clock lines between the two adjacent data lines DL. In this case, the clock lines may be shielded by the power lines PL (and the control lines CL) and coupling between the clock lines and the pixels PXL (refer to FIG. 16) may be suppressed or prevented.

As described above, when there is a limitation in the number of the first connection lines L_CN1 passing across the first area A1 of the connection films COF1 to COF4 due to the spatial limitation of the first area A1, the clock lines SC_CLK1 to SC_CLK8 and CR_CLK1 to CR_CLK8 may be connected to the timing controller 150 through a plurality of connection films COF1 to COF4.

While the present inventive concept has been shown and described with reference to certain embodiments thereof, it will be understood by those skilled in the art that various changes in forms and details may be made therein without departing from the spirit and scope of the present inventive concept as defined by the appended claims and their equivalents.

Accordingly, the technical scope of the present disclosure may be determined by on the technical scope of the accompanying claims.

What is claimed is:

1. A display device comprising:
   a display panel including data lines, gate lines, clock lines disposed between the data lines, pixels connected to the data lines and the gate lines in a display area, and a gate driving circuit connected to the clock lines and the gate lines in the display area;
   a printed circuit board on which a timing controller is mounted; and
   a connection film on which a data driver is mounted, connecting the timing controller and the data driver, connecting the data driver and the data lines, and connecting the timing controller and the clock lines,
   wherein the connection film includes:
      a base film including a first area on which the data driver is mounted and a second area surrounding the first area, the first area including a first side and a second side opposing the first side and disposed farther than the first side from the printed circuit board;

first input terminals and second input terminals disposed on one side of the base film and connected to the timing controller;

first output terminals disposed on another side of the base film and connected to the data lines;

second output terminals disposed on the another side of the base film and connected to the clock lines;

input lines extending from the first input terminals to the first area;

output lines extending from the first output terminals to the first area; and first connection lines connecting the second input terminals to the second output terminals and intersecting the first side and the second side of the first area, the first connection lines transferring clock signals received from the timing controller to the clock lines, and wherein the first connection lines are disposed between the output lines and the first connection lines and the output lines are alternately disposed, and wherein each of the first connection lines includes a pair of first connection lines to which clock signals having a phase difference of 180 degrees are applied and the pair of first connection lines are disposed adjacent to each other with no signal line interposed between the first connection lines in the pair of first connection lines.

2. The display device of claim 1, wherein the first connection lines do not cross the input lines and the output lines, and wherein the first connection lines, the input lines, and the output lines are disposed on a same layer on the base film.

3. The display device of claim 2, wherein the first connection lines overlap the data driver in a plane view and are electrically separated from the data driver.

4. The display device of claim 2, wherein the first connection lines include a plurality of groups, and wherein the groups are disposed to be spaced apart from each other with at least one output line interposed therebetween.

5. The display device of claim 1, wherein the pair of first connection lines are disposed between two adjacent output lines and are spaced apart from other connection lines except for the pair of first connection lines among the first connection lines with at least one output line interposed therebetween.

6. The display device of claim 1, wherein the clock lines include scan clock lines and carry clock lines, wherein the gate driving circuit includes a plurality of stages, wherein each of the stages generates a carry signal using a carry clock signal provided through a corresponding carry clock line among the carry clock lines in response to a start signal or a previous carry signal provided from a previous stage, and generates a scan signal using a scan clock signal provided through a corresponding scan clock line among the scan clock lines, wherein the scan signal is provided to a corresponding one of the gate lines, and wherein the scan clock lines are disposed to be spaced apart from the carry clock lines with at least one data line interposed therebetween.

7. The display device of claim 6, wherein the scan clock lines are disposed adjacent to one side of a corresponding stage among the stages, and wherein the carry clock lines are disposed adjacent to another side of the corresponding stage among the stages.

8. The display device of claim 6, wherein the first connection lines connected to the scan clock lines are spaced apart from the first connection lines connected to the carry clock lines with at least one output line interposed therebetween.

9. The display device of claim 1, wherein the display panel further includes at least one power line connected to the gate driving circuit, and wherein the connection film further includes:

at least one third input terminal disposed on the one side of the base film and connected to a power supply through the printed circuit board;

at least one third output terminal disposed on the another side of the base film and connected to the at least one power line; and at least one second connection line connecting the at least one third input terminal and the at least one third output terminal.

10. The display device of claim 9, wherein the at least one second connection line connecting the at least one third input terminal to the at least one third output terminal through the second area of the base film.

11. The display device of claim 9, wherein the at least one second connection line connecting the at least one third input terminal to the at least one third output terminal across the first area of the base film.

12. The display device of claim 1, further comprising a plurality of connection films on which a plurality of data drivers are mounted respectively, wherein each of the plurality of connection films connects the timing controller and the data driver, connects the data driver and corresponding data lines among the data lines, and connects the timing controller and corresponding clock lines among the clock lines.

13. The display device of claim 12, wherein the display panel further includes power lines connected to the gate driving circuit, wherein each of the connection films further includes:

third input terminals disposed on the one side of the base film and connected to a power supply through the printed circuit board;

third output terminals disposed on the another side of the base film and connected to the power lines; and second connection lines connecting the third input terminals and the third output terminals, and wherein the first connection lines are disposed between a pair of second connection lines among the second connection lines.

14. The display device of claim 13, wherein the pair of first connection lines to which the clock signals having the phase difference of 180 degrees are applied among the first connection lines are disposed between the pair of second connection lines.

15. A chip-on film package that is electrically connected between two substrates, comprising:

a base film including a first area on which an integrated circuit is mounted and a second area surrounding the first area, the first area including a first side and a second side opposing the first side and disposed farther than the first side from one of the two substrate;

first input terminals and second input terminals disposed on one side of the base film;

first output terminals and second output terminals disposed on another side of the base film;

input lines extending from the first input terminals to the first area;

output lines extending from the first output terminals to the first area; and first connection lines connecting the second input terminals to the second output terminals and intersecting the first side and the second side of the first area, the first connection lines transferring clock signals received from a timing controller to clock lines, wherein the first connection lines and the output lines are alternately disposed, and wherein each of the first connection lines includes a pair of first connection lines to which clock signals having a phase difference of 180 degrees are applied and the pair of first connection lines are disposed adjacent to each other with no signal line interposed between the first connection lines in the pair of first connection lines.

16. The chip-on film package of claim 15, wherein the first connection lines do not cross the input lines and the output lines, and wherein the first connection lines, the input lines, and the output lines are disposed on a same layer on the base film.

17. The chip-on film package of claim 16, wherein the first connection lines include a plurality of groups, and wherein the plurality of groups are disposed to be spaced apart from each other with the output lines interposed therebetween.

18. The chip-on film package of claim 15, wherein the pair of first connection lines are disposed between two adjacent output lines, and are spaced apart from other connection lines except for the pair of first connection lines among the first connection lines with at least one output line interposed therebetween.

* * * * *